United States Patent
Pelissier et al.

(10) Patent No.: US 9,602,114 B2
(45) Date of Patent: Mar. 21, 2017

(54) PHASE-LOCKED LOOP WITH MULTIPLE DEGREES OF FREEDOM AND ITS DESIGN AND FABRICATION METHOD

(71) Applicant: COMMISSARIAT A L'ENERGIE ATOMIQUE ET AUX ENERGIES ALTERNATIVES, Paris (FR)

(72) Inventors: Michael Pelissier, Grenoble (FR); Anton Korniienko, Lyons (FR); Mykhailo Zarudniev, Kiev (UA); Gèrard Scorletti, Ecully (FR); Olesia Mokrenko, Grenoble (FR); Eric Blanco, Decines-Charpieu (FR); Patrick Villard, Grenoble (FR); Gèrard Billiot, Saint-Nazaire les Eymes (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/853,247

(22) Filed: Sep. 14, 2015

(65) Prior Publication Data

US 2016/0079991 A1    Mar. 17, 2016

(30) Foreign Application Priority Data

Sep. 15, 2014  (FR) ..................... 14 58667

(51) Int. Cl.
*H03L 7/06* (2006.01)
*H03L 7/097* (2006.01)
(Continued)

(52) U.S. Cl.
CPC .......... *H03L 7/097* (2013.01); *G06F 17/5045* (2013.01); *H03L 7/08* (2013.01);
(Continued)

(58) Field of Classification Search
None
See application file for complete search history.

(56) References Cited

U.S. PATENT DOCUMENTS

| 2006/0171496 A1* | 8/2006 | Nakamuta ............... H03L 7/085 375/376 |
| 2008/0265959 A1* | 10/2008 | Kimura ................ H03L 7/0805 327/156 |
| 2014/0070859 A1 | 3/2014 | Waltari et al. |

OTHER PUBLICATIONS

Johen E. Bibel et al., "Guidelines for the selection of weighting functions for H-infinity control," AD-A251 781 Naval Surface Warfare Center, Jan. 1992. <http://www.dtic.mil/dtic/tr/fulltext/u2/a251781.pdf>.

(Continued)

*Primary Examiner* — Cassandra Cox
(74) *Attorney, Agent, or Firm* — Baker & Hostetler LLP

(57) ABSTRACT

A design method for a phase-locked loop comprises: a controlled-frequency oscillator; a phase comparator, to determine a phase difference between an output signal of the controlled-frequency oscillator and a reference signal; a corrector to receive as input a signal representative of the phase difference and to generate at its output a first correction signal; at least one second corrector, to receive as input a signal representative of or affected by a phase noise of the reference signal or of the output signal of the controlled-frequency oscillator and to generate at its output a second correction signal; and a circuit for generating a slaving signal for the controlled-frequency oscillator on the basis of the first and second correction signals; the method using the H-infinity method. Method for fabricating such a loop comprising a design step implementing this method. Phase-locked loop thus obtained.

16 Claims, 16 Drawing Sheets

(51) Int. Cl.
   *H03L 7/08* (2006.01)
   *G06F 17/50* (2006.01)
   *H04L 7/00* (2006.01)
   *H03L 7/099* (2006.01)

(52) U.S. Cl.
   CPC ............ *H04L 7/0079* (2013.01); *H03L 7/099* (2013.01); *H03L 2207/50* (2013.01)

(56) References Cited

OTHER PUBLICATIONS

Win Chaivipas et al., "Analysis and Design of Direct Reference Feed-Forward Compensation for Fast-Settling All-Digital Phase-Locked Loop," IEICE Trans. Electron., vol. E90-C, No. 4, Apr. 2007.

B. Indu Rani et al., "A three phase PLL with a dynamic feed forward frequency estimator for synchronization of grid connected converters under wide frequency variations," Electrical Power and Energy Systems, vol. 41, pp. 63-70, 2012.

R.B.Staszewski et al., "All-Digital TX Frequency Synthesizer and Discrete-time Receiver for Bluetooth Radio in 130-nm CMOS," IEEE Journal of Solid-State Circuits, vol. 39, No. 12, Dec. 2004.

R.B.Staszewski et al., "Phase-Domain All-Digital Phase-Locked Loop," IEEE Transaction on Circuits and Systems—II: Express Briefs, vol. 52, No. 3, Mar. 2005.

Ankit Bansal et al., "Design and Analysis of Robust H-infinity Controller," Control Theory and Informatics ISSN 2224-5774, vol. 3, No. 2, 2013 National Conference on Emerging Trends in Electrical, Instrumentation & Communication Engineering.

Glenn E. R. Cowan et al., "Phase-Locked Loop Architecture for Enhanced Voltage-Controlled Oscillator Phase-Noise Suppression," 2013 IEEE Symposium on Circuits and Systems, pp. 2476-2479, XP032446453.

Seungkee Min et al., "A 90nm CMOS 5-GHz Ring-Oscillator PLL With Delay-Discriminator-Based Active Phase-Noise Cancellation," IEEE Journal of Solid-State Circuits, vol. 48, No. 5, May 2013, pp. 1151-1160, XP011505122.

* cited by examiner

PHASE-LOCKED LOOP WITH MULTIPLE DEGREES OF FREEDOM AND ITS DESIGN AND FABRICATION METHOD

CROSS-REFERENCE TO RELATED APPLICATION

This application claims priority to foreign French patent application No. FR 1458667, filed on Sep. 15, 2014, the disclosure of which is incorporated by reference in its entirety.

FIELD OF THE INVENTION

The invention pertains to a phase-locked loop, to methods for the design and fabrication of such phase-locked loops and to a radio frequency receiver comprising such a phase-locked loop.

BACKGROUND OF THE INVENTION

The phase-locked loop (or PLL) is an electronic circuit well known per se, comprising a controlled-frequency oscillator (generally a voltage controlled oscillator, or VCO) and a closed-loop corrector, or controller, generating a signal for driving the said oscillator so as to slave its output signal to a reference signal (the corrector is also called a "filter", since in the simplest embodiments it is a low-pass filter). It is used notably to produce frequency synthesizers; indeed, by introducing a frequency divider into the feedback loop of the corrector, an output signal of the VCO is obtained at a frequency which is a multiple of the reference signal, generated for example by a quartz oscillator.

The output signal of the VCO (and therefore of the PLL) is inevitably affected by phase noise, which has multiple origins. The main sources of phase noise are the reference oscillator, generating the reference signal, and the frequency controlled oscillator. The corrector is generally designed in such a way as to minimize the influence of these sources of noise in the spectral operating band of the phase-locked loop, that is to say, to reject the phase noise in a given frequency band.

As will be explained in greater detail hereinafter, however, in a phase-locked loop known from the prior art, a fundamental limit exists to the rejection of the phase noise. More precisely, it is possible to demonstrate that the corrector cannot effectively filter, at one and the same frequency, the reference phase noise and that due to the VCO. To obtain an output signal with low phase noise despite this intrinsic limitation, it is necessary to use very high-quality—and therefore expensive—VCOs and reference oscillators that are difficult to integrate on silicon technologies and/or high-order correctors. Even when taking these precautions, the intrinsic limitations of the conventional architecture of phase-locked loops prevent sufficiently effective noise filtering for certain applications.

SUMMARY OF THE INVENTION

The invention is aimed at remedying this drawback of the prior art and at affording a phase-locked loop exhibiting better rejection of the phase noise without necessarily resorting to VCOs and reference oscillators of very high quality and/or to a high-order corrector.

In accordance with the invention, such an aim is achieved by virtue of a phase-locked loop, or PLL, "with multiple degrees of freedom". This is intended to mean a PLL comprising at least two correctors having linearly independent input signals. It should be understood that these correctors can be produced in the form of a single physical device, but exhibiting at least two inputs, at least one output and two input/output relations (transfer functions) that are linearly independent.

Documents [ChM-2007] and [SNI-2012] disclose PLLs which can be considered to have "two degrees of freedom".

In the case of document [ChM-2007], a PLL of conventional type is modified by the addition of a signal path carrying out a feed-forward control with the aim of increasing the response speed of the loop. This signal path exhibits a constant gain as a function of frequency, which does not allow any improvement in the phase noise rejection performance. The possibility of using a corrector with feed-forward control exhibiting a gain which varies as a function of frequency is alluded to, but no design method for such a corrector is mentioned. Moreover, the document does not suggest that such a corrector could be used to reduce the phase noise of the output signal.

Document [SNI-2012] also discloses a PLL comprising, in addition to a conventional corrector, a signal path carrying out feed-forward control. It comprises a frequency estimator followed by a low-pass filter. Neither in this case is it a question of improving the phase noise rejection, but only of increasing the swiftness of synchronization and of ensuring the stability of the phase-locked loop.

Document US 2014/0070859 describes a phase-locked loop equipped with a mechanism for correcting jitter.

A object of the invention making it possible to achieve the aim mentioned hereinabove is a design method for a phase-locked loop, of the type comprising:

a controlled-frequency oscillator;

a phase comparator, configured to determine a phase difference between an output signal of the said controlled-frequency oscillator and a reference signal;

a corrector, termed the first corrector, configured to receive as input a signal representative of the said phase difference and to generate at its output a signal termed the first correction signal;

at least one other corrector, termed the second corrector, configured to receive as input a signal representative of or affected by a phase noise of the said reference signal or of the said output signal of the said controlled-frequency oscillator and to generate at its output a signal termed the second correction signal; and a means for generating a slaving signal for the said controlled-frequency oscillator on the basis of the said first and second correction signals;

the said method comprising a step of determining transfer functions of the said correctors and being characterized in that the said step is implemented, by means of a computer, by applying the $H_\infty$ method utilizing:

as input, a weighting function for a phase noise of the said controlled-frequency oscillator, termed the first weighting function, and a weighting function for a phase noise of a reference signal, termed the second weighting function, and which are determined on the basis of nominal power spectral densities of the said noise; and as output, at least one weighting function for a phase noise of an output signal of the phase-lock loop or of an error in tracking the said reference signal, termed the third weighting function, determined on the basis of a phase noise power spectral density template of the said output signal having to be complied with.

According to various embodiments of such a method:

The said step of determining transfer functions of the said correctors can comprise the following sub-steps:

a) determining a nominal power spectral density of the said reference signal;

b) determining a nominal power spectral density of the phase noise of the said controlled-frequency oscillator;

c) determining a phase noise power spectral density template of the said output signal having to be complied with;

d) determining, on the basis of the said nominal power spectral densities and of the said power spectral density template, at least the said first, second and third weighting functions;

e) constructing an augmented system through the said weightings; and f) applying the $H_\infty$ method to the said augmented system so as to synthesize the transfer functions of the said correctors.

The said step d) can also comprise the determination of a weighting function at output, termed the fourth weighting function, for the power spectral density of the said slaving signal on the basis of a power spectral density template of the said slaving signal to be complied with.

The method can also comprise a sub-step d') of simplifying the weighting functions determined during sub-step d), the weighting functions thus simplified being used during the said sub-step e), the said simplification being implemented by approximating the said weighting functions by transfer functions of lower order and of smaller modulus at least over a spectral operating span of the phase-locked loop.

The method can also comprise a sub-step g) of simplifying the transfer functions synthesized during the said sub-step f), the said simplification being implemented by approximating the said transfer functions by transfer functions of lower order.

The said step f) can be implemented with an extra constraint, according to which the modulus of the transfer function for going from the said output signal of the said controlled-frequency oscillator to the said reference signal exhibits, in at least one spectral span, a slope of greater than or equal to +20 db/decade and preferably of greater than or equal to 40 dB/decade.

The said phase-locked loop can comprise at least one other corrector, termed the third corrector, configured to receive as input a signal representative of or affected by a phase noise generated inside the said loop, other than the said phase noise of the said output signal of the said controlled-frequency oscillator, and to generate at its output a signal termed the third correction signal, the said means for generating a slaving signal for the said controlled-frequency oscillator being configured to generate the said slaving signal also on the basis of the said third correction signal, the said step, implemented by the said $H_\infty$ method, of determining transfer functions of the said correctors using as input also a weighting function for the said phase noise other than the said phase noise of the said output signal of the said controlled-frequency oscillator, also determined on the basis of the power spectral density of the said noise.

Another object of the invention is a method for fabricating a phase-locked loop, of the type comprising:

a controlled-frequency oscillator;

a phase comparator for determining a phase difference between an output signal of the said controlled-frequency oscillator and a reference signal;

a corrector, termed the first corrector, configured to receive as input a signal representative of the said phase difference and to generate at its output a signal termed the first correction signal;

at least one other corrector, termed the second corrector, configured to receive as input a signal representative of or affected by a phase noise of the said reference signal or of the said output signal of the said controlled-frequency oscillator and to generate at its output a signal termed the second correction signal; and a means for generating a slaving signal for the said controlled-frequency oscillator on the basis of the said first and second correction signals;

the said method comprising:

a step of design of the said phase-locked loop; and a step of physical production of the phase-locked loop thus designed;

characterized in that the said design step is implemented by a method such as defined hereinabove.

Advantageously, the said phase-locked loop can comprise at least one other corrector, termed the third corrector, configured to receive as input a signal representative of or affected by a phase noise generated inside the said loop, other than the said phase noise of the said output signal of the said controlled-frequency oscillator, and to generate at its output a signal termed the third correction signal, the said means for generating a slaving signal for the said controlled-frequency oscillator being configured to generate the said slaving signal also on the basis of the said third correction signal.

Yet another object of the invention is a phase-locked loop comprising:

a controlled-frequency oscillator;

a phase comparator for determining a phase difference between an output signal of the said controlled-frequency oscillator and a reference signal;

a corrector, termed the first corrector, configured to receive as input a signal representative of the said phase difference and to generate at its output a signal termed the first correction signal;

at least one other corrector, termed the second corrector, configured to receive as input a signal representative of or affected by a phase noise of the said reference signal or of the said output signal of the said controlled-frequency oscillator and to generate at its output a signal termed the second correction signal; and a means for generating a slaving signal for the said controlled-frequency oscillator on the basis of the said first and second correction signals;

characterized in that the said first and second correctors exhibit non-constant transfer functions, chosen so as to allow the rejection, in one and the same frequency band, of the phase noise of the said reference signal and of the phase noise of the said output signal of the said controlled-frequency oscillator.

According to various embodiments of such a phase-locked loop:

The said second corrector can be configured to receive as input: either a signal representative of the phase of the said reference signal; or an estimation of the phase noise of the said reference signal.

The said phase-locked loop can also comprise a circuit for determining an estimation of the phase noise of the said reference signal comprising: a delayer module, configured to generate a version delayed by a time $T_d$ of the said reference signal; a phase-shifter module, configured to generate a version of the said reference signal exhibiting a phase shift $\delta\varphi$, with $$\delta\varphi - \omega_{ref}T_d = \frac{\pi}{2} + 2\pi k, k \in Z,$$

where $\omega_{ref}$ is the frequency of the said reference signal; and a mixer configured to receive as input the output signals of the said delayer and phase-shifter modules and to provide their product at its output; the said second corrector being configured to receive as input the said estimation of the phase noise of the said reference signal.

The said second corrector can be configured to receive as input: either a signal representative of the phase of the said output signal of the said controlled-frequency oscillator; or an estimation of the phase noise of the said output signal of the said controlled-frequency oscillator.

The said phase-locked loop can also comprise a circuit for determining an estimation of the phase noise of the said output signal comprising: a delayer module, configured to generate a version delayed by a time $T_d$ of the said output signal; a phase-shifter module, configured to generate a version of the said output signal exhibiting a phase shift $\delta\varphi$, with $$\delta\varphi - \omega_o T_d = \frac{\pi}{2} + 2\pi k, k \in Z,$$

where $\omega_o$ is the frequency of the said output signal; and a mixer configured to receive as input the output signals of the said delayer and phase-shifter modules and to provide their product at its output; the said second corrector being configured to receive as input the said estimation of the phase noise of the said output signal.

The said phase-locked loop can also comprise at least one other corrector, termed the third corrector, configured to receive as input: a signal representative of or affected by a phase noise generated inside the said loop, other than the said phase noise of the said output signal of the said controlled-frequency oscillator, and to generate at its output a signal termed the third correction signal, the said means for generating a slaving signal for the said controlled-frequency oscillator being configured to generate the said slaving signal also on the basis of the said third correction signal.

Yet another object of the invention is a radio frequency reception chain comprising: a radio frequency preamplifier; a mixer configured to receive as input an output signal of the said radio frequency preamplifier and a frequency conversion sinusoidal signal, and to provide as output a signal at intermediate frequency; and a circuit for generating the said frequency conversion sinusoidal signal; in which the said circuit for generating the said frequency conversion sinusoidal signal comprises such a phase-locked loop, using the said mixer in the guise of mixer of the said circuit for determining an estimation of the phase noise of the said output signal, and an oscillator configured to generate the said reference signal.

BRIEF DESCRIPTION OF THE DRAWINGS

Other characteristics, details and advantages of the invention will emerge on reading the description provided with reference to the appended drawings given by way of example and which represent, respectively:

FIG. 12b, a condensed representation of the block diagram of FIG. 12a;

FIGS. 13a, 13b and 13c, transfer functions of the phase noise of the VCO and of the reference signal which are obtained by using the weightings of FIG. 12a, as well as the constraints that these transfer functions must comply with;

FIGS. 14 and 15, the transfer functions of the correctors synthesized using the weightings of FIG. 12a;

DETAILED DESCRIPTION

Figure 1:
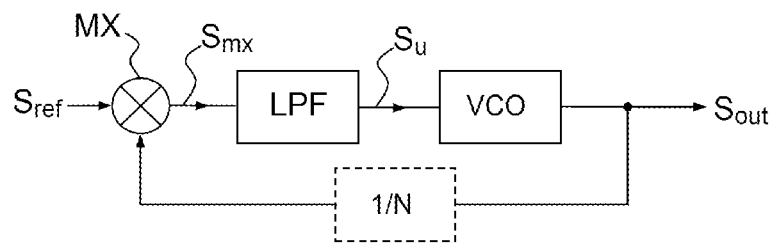
FIGS. 1 and 2, two representations of a block diagram of a PLL "with one degree of freedom" known from the prior art.

FIG. 1 shows the block diagram of an analogue PLL, receiving at its input a reference signal $s_{ref}=V_{ref}\sin[\varphi_{ref}(t)]$.

The reference signal and the output signal of the PLL, $s_{out}=V_{out}\cdot\cos[\phi(t)]$ are provided to the inputs of a mixer MX, which provides their product to its output: $s_{mx} \propto \sin[\phi_{ref}(t)]\cdot\cos[\phi(t)] \propto \sin[\phi_{ref}(t)+\phi(t)]\cdot\sin[\phi_{ref}(t)-\phi(t)]$. It is assumed that $\phi_{ref}(t)$ and $\phi_{out}(t)$ are essentially phase ramps, this signifying that the reference and output signals deviate little from perfect sinusoids. A low-pass filter LPF deletes the "high-frequency" component $\sin[\phi_{ref}(t)+\phi(t)]$ of $s_{mx}$; at the output of the filter the signal $s_u \propto \sin[\phi_{ref}(t)-\phi(t)]$ is therefore obtained. Assuming $\phi_{ref}(t) \cong \phi(t)$—this normally being the case when conditions are steady—it is possible to approximate the sine by its argument, thus giving: $s_u \propto \phi_{ref}(t)-\phi(t)=\Delta\phi(t)$. Stated otherwise, the signal $s_u$ is proportional to the instantaneous phase difference between the reference signal and the output signal. This signal $s_u$ drives a voltage controlled oscillator VCO, which generates the output signal $s_{out}$. If the filter, or corrector, LPF is dimensioned in an opportune manner, the VCO is slaved to the reference signal, that is to say $\phi(t)$ follows $\phi_{ref}(t)$ faithfully. If a frequency-divider block (represented by a dashed contour in FIG. 1, N being the division factor) is introduced onto the feedback path, between the output signal and the mixer, $\phi(t)$ will follow $N\phi_{ref}(t)$, thus carrying out a multiplication of the frequency of the reference signal.

Figure 2:
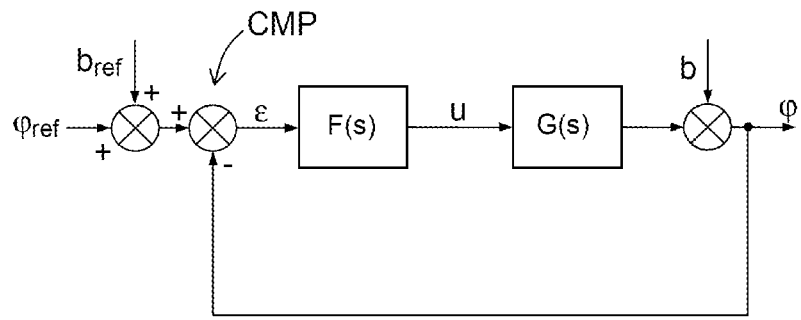

Under conditions where the signals are small (that is to say for $\phi_{ref}(t) \cong \phi(t)$), the manner of operation of the PLL can be illustrated by the diagram of FIG. 2. This diagram must not be confused with an electrical diagram: its input and output signals are not voltage values, but directly the phases $\phi_{ref}$ and $\phi$. The mixer is modeled by a phase comparator CMP, providing at its output a difference signal "ε", and the VCO by a block exhibiting a transfer function G(s), typically an integrator. The low-pass filter, characterized by a transfer function F(s) and generating a slaving signal "u", will be called hereinafter the "corrector" to underline the fact that it ensures functions other than low-pass filtering, such as the stabilization of the loop, the synchronization of the PLL, the determination of a minimum passband etc.

The signal $\phi_{ref}$ can be considered to be the useful signal to which the output $\phi$ of the PLL must be slaved. The corrector must therefore ensure this slaving. On the other hand, the noise signals b and $b_{ref}$ are parasitic signals—due respectively to the VCO and to the oscillator producing the reference signal—which must be filtered in such a way that their contributions to the output of the PLL $\phi$ is as low as possible while guaranteeing slaving. The choice of the corrector F(s) which guarantees these performance properties of the PLL will subsequently be called the optimization of the phase noise of the PLL. Other sources of phase noise exist (phase comparator noise, frequency divider noise, etc.) but their contribution is generally less significant.

The slaving of the PLL can be carried out via an analogue implementation or a digital one.

Given that the noise filtering requirement is naturally expressed in the form of a template in the Power Spectral Density (PSD) of the signals, it is beneficial to express the PSD of the output of the PLL with respect to the PSD of input signals considered. We therefore obtain, by considering the VCO noise, the noise of the reference and the reference signal to be uncorrelated:

$$S_\phi(j2\pi f) = \left|\frac{1}{1+G(j2\pi f)F(j2\pi f)}\right|^2 S_b(j2\pi f) + \quad (1)$$

-continued
$$\left|\frac{F(j2\pi f)G(j2\pi f)}{1+G(j2\pi f)F(j2\pi f)}\right|^2 S_{bref}(j2\pi f) ++$$

$$\left|\frac{F(j2\pi f)G(j2\pi f)}{1+G(j2\pi f)F(j2\pi f)}\right|^2 S_{\phi ref}(j2\pi f)$$

where $S_x$ is the PSD of the signal "x", with "x" being able to take the values: $\phi$, $\phi_{ref}$, b, $b_{ref}$, f the frequency expressed in Hz.

Equation (1) features the moduli squared of the frequency responses of the transfer functions which link the reference phase signal $\phi_{ref}$ and the phase noise of the reference, $b_{ref}$, and of the VCO, b, with the output of the PLL. The transfer function for going from the noise of the VCO, b, to the output of the PLL $\phi$, will be denoted $$S(s) = \frac{1}{1+G(s)F(s)}$$

and will be called the "sensitivity function". The transfer function for going from the phase noise of the reference $b_{ref}$ (or equivalently the phase signal of the reference $\phi_{ref}$) to the output of the PLL will be denoted $$T(s) = \frac{G(s)F(S)}{1+G(s)F(s)}$$

and will be called the "complementary sensitivity function".
It is easy to appreciate that:

$$S(s)+T(s) = \frac{1}{1+G(s)F(s)} + \frac{G(s)F(s)}{1+G(s)F(s)} = 1 \quad (2)$$

Figure 3:
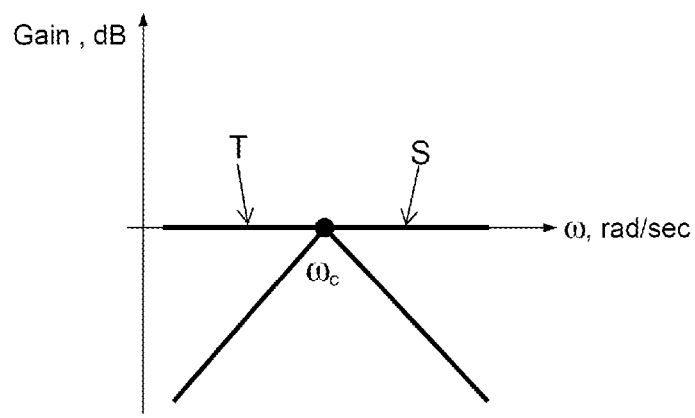
FIG. 3, a graphic making it possible to understand why a PLL of the type of FIGS. 1 and 2 cannot effectively filter all the contributions to the phase noise of its output signal.

Generally the transfer function S is that of a high-pass filter so as to be able to filter the contribution of the noise b of the VCO around the carrier frequency of the PLL. Consequently, in view of relation (2), the transfer function T represents a low-pass filter, which is responsible for shaping the reference noise $b_{ref}$. Moreover, it may be demonstrated that because of relation (2), and whatever corrector F(s) is chosen to ensure the stability of the PLL, it is not possible, for a given frequency, for the moduli of the frequency responses of two transfer functions S(s) and T(s) to both be low i.e. $|S(j2\pi f)|<<1$ and $|T(j2\pi f)|<<1$ for $f\in[f_{min}, f_{max}]$. If the modulus of the frequency response of the sensitivity function S(s) is low for a given frequency ($|S(j2\pi f)|<<1$), it is inevitable that the modulus of the frequency response of the complementary sensitivity function T(s) is close to 1 ($|T(j2\pi f)|\approx 1$) so that relation (2) is complied with (see FIG. 3, where S and T are, respectively, a high-pass filter and a low-pass filter with one and the same cutoff angular frequency, $\omega_c$). Reciprocally, if $|T(j2\pi f)|<<1$ then $|S(j2\pi f)|\approx 1$. Thus, relation (2) implies a fundamental limitation of the performance of a PLL according to the prior art in terms of filtering of the phase noise. Indeed, if the moduli of the transfer functions S and T cannot be low at one and the same frequency or in one and the same frequency span, it is not possible to filter the two sources of noise b and $b_{ref}$ at the same time at this frequency or in this frequency span. This limitation is inherent to the structure of the closed loop with one degree of freedom, represented in FIGS. 1 and 2; it compels the acceptance of a compromise favouring the filtering of one noise source with respect to the other. The invention makes it possible to overcome this fundamental limitation by introducing at least one additional degree of freedom into the slaving of the VCO. This makes it possible to control and to optimize separately the constraints in relation to each of the sources of noise of the PLL, and therefore to guarantee that the two transfer functions linking the sources of phase noise with the output of the PLL can have frequency responses with low gains at the same time over a certain frequency span in order to carry out the noise filtering.

Figure 4A:
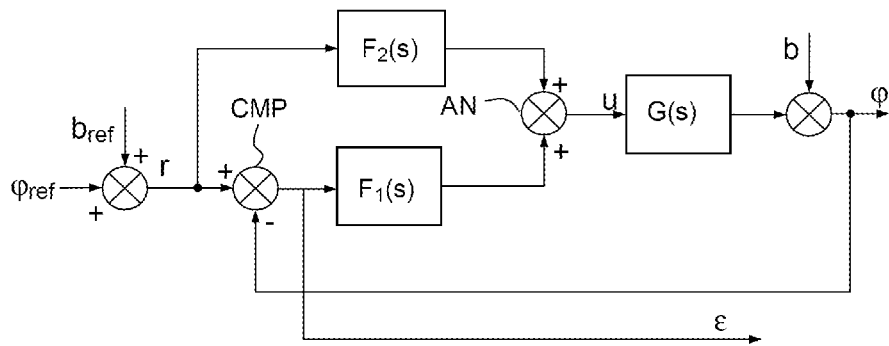
FIGS. 4a and 4b, the block diagrams of two variants of a PLL "with two degrees of freedom" according to a first embodiment of the invention using a second corrector in feed-forward control mode.

FIG. 4a illustrates a first embodiment of the invention which is differentiated from that of FIG. 2 by the presence, in addition to the corrector $F_1$ arranged between the phase comparator and the VCO (subsequently called the "first corrector"), of a second corrector $F_2$ connected in feed-forward control mode ("feed-forward"), receiving at its input the noisy phase of the reference signal: $r=\phi_{ref}+b_{ref}$. The output signals of the two correctors (correction signals) are summed by an adder node AN—e.g. implemented by an analog adder built around an operational amplifier, or a digital adder circuit—to provide the slaving signal for the VCO, u. More generally, the correction signals may be combined—linearly or otherwise—to provide the slaving signal u; in this case, the adder node AN may be replaced by a suitable digital or analog electronics circuit.

In this embodiment, the first corrector $F_1$ acts both on the noise of the VCO and on the noise of the reference, while the second corrector $F_2$ acts specifically on the noise of the reference.

Figure 5A:
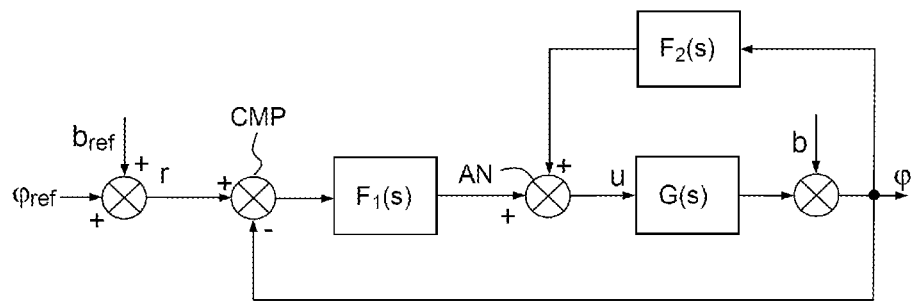
FIGS. 5a and 5b, the block diagrams of two variants of a PLL "with two degrees of freedom" according to a second embodiment of the invention using a second corrector in feedback mode.

FIG. 5a illustrates a second embodiment of the invention which is differentiated from that of FIG. 4a by the fact that the second corrector is connected in feedback mode, receiving at its input the noisy output signal $\phi$. In this embodiment, the first corrector $F_1$ acts both on the noise of the VCO and on the noise of the reference, while the second corrector $F_2$ acts specifically on the noise of the VCO.

Figure 4B:
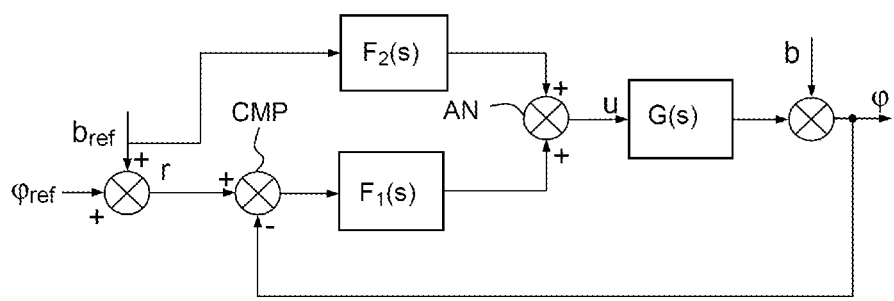

It is however difficult to produce PLLs based on these two schematic diagrams since in practice it turns out to be tricky to measure directly the phase noise signal at the input of the corrector $F_2(s)$; indeed, the signal "r" which appears in diagrams 4a and 5a is not, in reality, measurable in an electronic circuit. For this reason, it is generally preferable to use an extra circuit which receives as input a noisy periodic voltage signal and provides at its output an estimation of the phase noise affecting this signal (for an embodiment of such a circuit, see FIG. 20 and the corresponding part of the description). This estimation of the phase noise can advantageously be used as input of the second corrector $F_2(s)$, as illustrated in FIG. 4b (for the case of a feed-forward control connection) and 5b (for the case of a feedback connection).

It is also possible to combine feed-forward control and feedback to produce a PLL with three degrees of freedom; such a PLL will be described further on with reference to FIG. 25.

Figure 27:
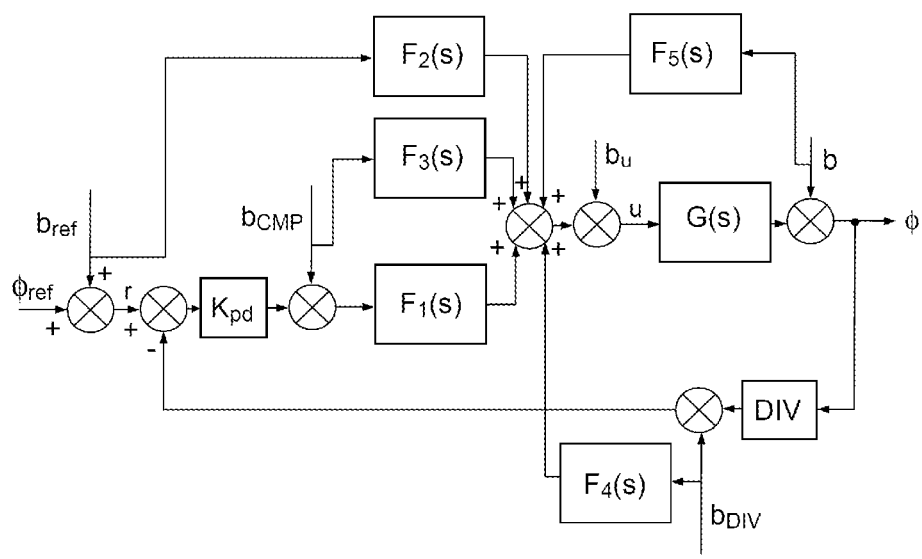
FIG. 27, the block diagram of a PLL with five degrees of freedom.

It is also possible to produce phase-lock loops with more than three degrees of freedom to correct sources of noise other than the reference signal and the VCO, for example the noise introduced by a frequency divider. By way of example, FIG. 27 illustrates the schematic diagram of a PLL with five degrees of freedom comprising, in addition to the correctors $F_1$ and $F_2$ already present in the PLL with two degrees of freedom of FIG. 4b, a third corrector $F_3$, a fourth corrector $F_4$ and a fifth corrector $F_5$. These extra degrees of freedom make it possible to reject, in addition to the noise of the VCO and of the reference, the noise of the comparator $b_{CMP}$, that of the frequency divider DIV, $b_{DIV}$ and the total noise introduced by the filters, $b_u$.

The invention also proposes a systematic method for the design (synthesis of the transfer functions) of the correctors which will be described in detail hereinafter, with the aid of FIGS. 6a to 19. This method uses the "$H_\infty$" (or "H-infinity") method, known from the prior art, making it possible to satisfy a constraint on the phase noise at output, expressed by a template of PSD of the said phase noise—and optionally one or more other constraints—being given a reference oscillator and a controlled-frequency oscillator with their own performance in terms of phase noise, also expressed by templates of PSD. Advantageously, this method is implemented by computer, this signifying that at least one of its steps is implemented using a computer. Recourse to a systematic design method such as this is all the more necessary the higher the number of degrees of freedom of the PLL. Without a systematic approach, the dimensioning of the five correctors of the PLL of FIG. 27, for example, would be extremely complex. The systematic method of transfer functions of the correctors will be presented in the case of a PLL with two degrees of freedom, but can readily be generalized.

A general introduction to the $H_\infty$ method and to the use of weighting functions within the framework of this method—this constituting a significant aspect of the invention—can be found in the following document: [Bib-1992], [ScF-2009] and [SkP-2005].

In addition to guaranteeing predefined performance in terms of rejection of the phase noise, the correctors must advantageously ensure that the output signal $\phi$ follows the signal $\phi_{ref}$ at input, and that therefore the error signal $\epsilon$ tends to zero as the time tends to infinity. In accordance with the final value theorem, assuming that the PLL is stable, the correctors must ensure:

$$\lim_{t \to +\infty} \epsilon(t) = \lim_{s \to 0} s\epsilon(s) = \lim_{s \to 0} sS(s)\phi_{ref}(s) = 0 \quad (3)$$

We consider the case of a reference signal in the form of a phase ramp (the voltage signal $s_{ref}$ is therefore a sinusoid); its Laplace transform is therefore $\phi_{ref}(s)=As^{-2}$, where A is the slope of the ramp. We therefore obtain:

$$\lim_{p \to 0} sS(s)\varphi_{ref}(s) = \lim_{p \to 0} sS(s)As^{-2} = \lim_{s \to 0} As^{-1}S(s) = 0 \quad (3')$$

from which it is deduced that the sensitivity function must exhibit a slope of at least +40 dB/dec for low frequencies.

As a variant, if only synchronization in terms of frequency is required and not in terms of frequency and phase, it is only necessary to ensure that $\epsilon$ tends to a constant value, possibly different from zero. In this case, it is possible to relax the condition on the sensitivity function slope at low frequency, which need only be greater than or equal to +20 dB/dec.

Furthermore, it is desired to require that the PSD of the phase noise at output (FIG. 7) complies with a "template" imposed by the specifications defined by the boundaries represented by the hatching; stated otherwise, the PSD of the output phase noise must lie below these boundaries; the template not being defined for all the frequencies, it is advantageously replaced by the continuous function $L_\phi(f)$.

These output constraints must be complied with while taking account of the intrinsic performance of the hardware components at the level of the phase noise of the reference oscillator, $L_{bref}(f)$ (FIG. 6a), and that of the controlled-frequency oscillator $L_b(f)$ (FIG. 6b), which are provided by the technical specifications of these hardware components.

Figure 8:
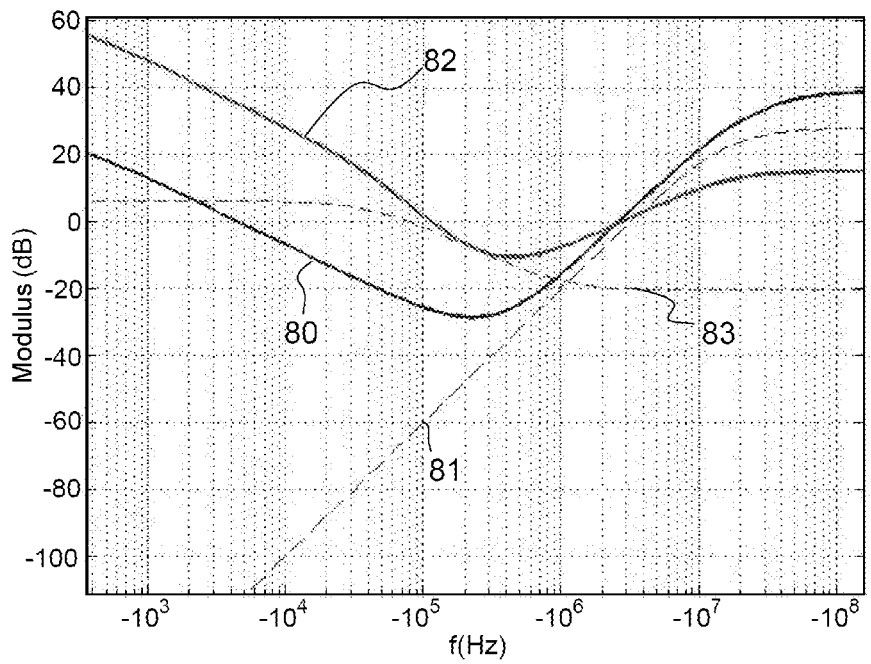
FIGS. 8 and 9, constraints on the closed loop transfer functions derived from the said frequency templates and used in a design method according to an embodiment of the invention.

The templates, represented by continuous lines in FIG. 8, for the moduli of the frequency responses of the two transfer functions are determined on the basis of the templates of the PSDs $L_\phi(f)$, $L_{bref}(f)$ and $L_b(f):L_\phi(f)/L_{bref}(f)$—that is to say the constraint on $|S(j2\pi f)|$ (curve 80)—and $L_\phi(f)/L_b(f)$—that is to say the constraint on $|T(j2\pi f)|$ (curve 82).

In accordance with the $H_\infty$ method, the constraints on the moduli of the frequency responses of the transfer functions $S(s)$ and $T(s)$ expressed by these templates are modeled by transfer functions termed "weightings". In the case of a system like that of the invention, two sorts of weightings exist: those at input $W_i$ and those at output $W_o$. The weightings can be chosen to be whitening filters, in which case $W_i$ is the inverse of the characteristic of PSD in terms of input noise and $W_o$ is the inverse of the characteristic of PSD in terms of output noise. More generally, we consider the case of a generic transfer function $H(s)$, wherein the modulus squared of the frequency response must comply with the constraints imposed by the noise PSD masks at input and at output $L_{in}(f)$ and $L_{out}(f)$. We then write:

$$|H(j2\pi f)|^2 < (|W_o(j2\pi f)W_i(j2\pi f)|^{-1})^2 = L_{out}(f)/L_{in}(f)$$
hence:

$$|W_o(j2\pi f)H(j2\pi f)W_i(j2\pi f)| < 1.$$

In the case of the PLL of FIG. 4a, it is possible to use three weighting functions: two at input ($W_b$ and $W_{bref}$) and one at output ($W_\phi$) and such that: $|W_\phi W_b|^{-1}$ approximates the constraint on $|S(j2\pi f)|$ and $|W_\phi W_{bref}|^{-1}$ approximates the constraint on $|T(j2\pi f)|$. In reality, as the constraints exhibit a complex form, this approach would lead to controllers of high order. It is therefore preferable to replace the original constraints (continuous lines in FIG. 8), obtained on the basis of the specifications (FIG. 7) and technical specifications of the hardware components (FIGS. 6a and 6b), by stronger, simplified constraints (lower than the original constraints at all the frequencies), exhibiting a limited number (one or two, or even three but preferably not more) of changes of slope and asymptotic slopes of ±20 dB/dec or of ±40 dB/dec, or even of ±60 dB/dec and preferably not more.

Simplified constraints are illustrated dashed in FIG. 8. We note that the simplified constraint 81 on $L_\phi(f)/L_b(f)$—and therefore on the sensitivity function $S(s)$—exhibits a slope of +40 dB/decade between $10^2$ and $10^6$ Hz, so as to ensure that the phase error $\epsilon$ tends to zero when conditions are steady (below $10^2$ Hz the slope of the modulus of the frequency response of the sensitivity function is no longer of significance since this modulus is extremely small, of the order of −100 dB). Curve 83 represents the simplified constraint on $|T(j2\pi f)|$. It is also noted that the cutoff frequencies for the attenuation of the two types of noise (attenuation greater than 6 dB simultaneously for the two functions) are more than two decades apart ($10^7$ Hz for the noise of the VCO, less than $10^5$ Hz for the noise of the reference), whilst they are close or coincident in the case of an architecture with 1 degree of freedom.

Figure 9:
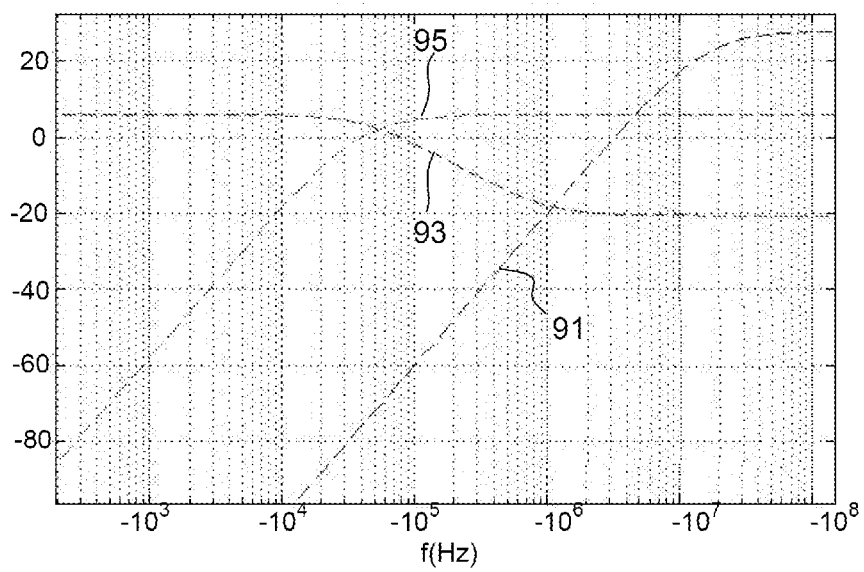

As a variant, it is possible to use the phase error $\epsilon$ to impose the performance constraints on the phase noise. This leads to constraining the PSD of the error $\epsilon$ with respect to that of two signals of the noise (reference and VCO) by using an equivalent constraint on $L_\epsilon/L_{bref}$ (the constraint on $L_\epsilon/L_b$ is the same as that on $L_\phi/L_b$). In this case, too, it will be appropriate to simplify the constraints. FIG. 9 illustrates the simplified constraints on $L_\phi/L_b=L_\epsilon/L_b$ (91), on $L_\phi/L_{bref}$ (93) and on $L_\epsilon/L_{bref}$ (95).

Figure 10:
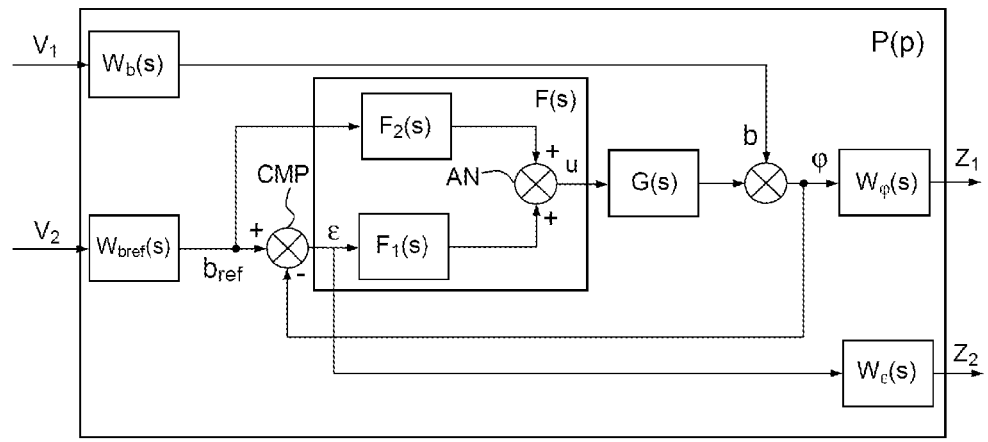
FIG. 10, a block diagram of a PLL of the type of FIG. 4a, "augmented" by the weighting functions aimed at rejecting the phase noise according to the templates of FIGS. 8 and 9.
Figure 11:
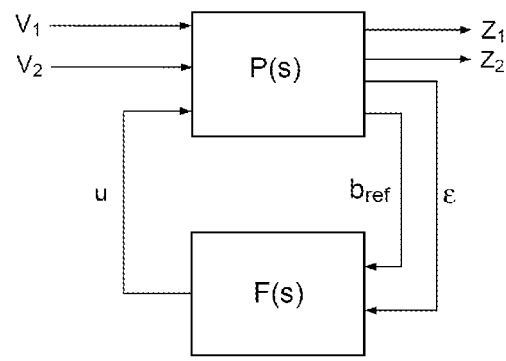
FIG. 11, a condensed representation of the block diagram of FIG. 10.

FIG. 10 illustrates the "augmented" system consisting of the phase-lock loop of FIG. 4a and its weighting functions at input, $W_b(s)$ and $W_{bref}(s)$ and at output $W_\phi(s)$ and $W_\epsilon(s)$. In reality, only one of these two weightings ngs at output (by choice) is used for the synthesis of the correctors (the form of the weighting functions at input depends on this choice). It is possible to distinguish two constituent parts of this augmented system: the (vectorial) corrector $F(s)$, comprising the two correctors $F_1$ and $F_2$ to be synthesized and the adder node combining their outputs so as to generate the slaving signal u, and a part termed the "augmented process" (or "augmented plant") $P(s)$, comprising all the other elements. The input signals $v_1$ and $v_2$ (which are transformed into the noise b and the noise $b_{ref}$) and output signals $z_1$ and $z_2$ (obtained by weighting $\phi$ and $\epsilon$, respectively) are, by construction of the weighting functions, white noise. FIG. 11 shows a condensed representation of the augmented system.

The transfer function $P(s)$ is given, since it depends on the topology of the PLL and $G(s)$, as well as the weightings which have been determined in such a way as to satisfy the constraints on the phase noise. The transfer function $F(s)$ is synthesized, in accordance with the $H_\infty$ method, in such a way as to satisfy the condition $$\|P(s) \star F(s)\|_\infty < 1 \quad (4)$$

where the operator "$\star$" indicates the Redheffer product and $\|\cdot\|_\infty$ indicates the $H_\infty$ norm. The search for a vector transfer function $F(s)$ satisfying inequality (4) is a classical problem which can be solved, with the aid of a computer, by numerical calculation algorithms well known from the prior art; see for example [ScF-2009].

In accordance with the invention, the synthesis of the correctors can be subject to other constraints, for example:
  robust stability, which imposes $|S(j2\pi f)|_{dB} < 6$ dB $\forall f$;
  limitation of the PSD of the slaving signal, or control signal, u(t).

For the choice of the weightings making it possible to satisfy these constraints it will be possible to refer to [ScF-2009].

Figure 12A:
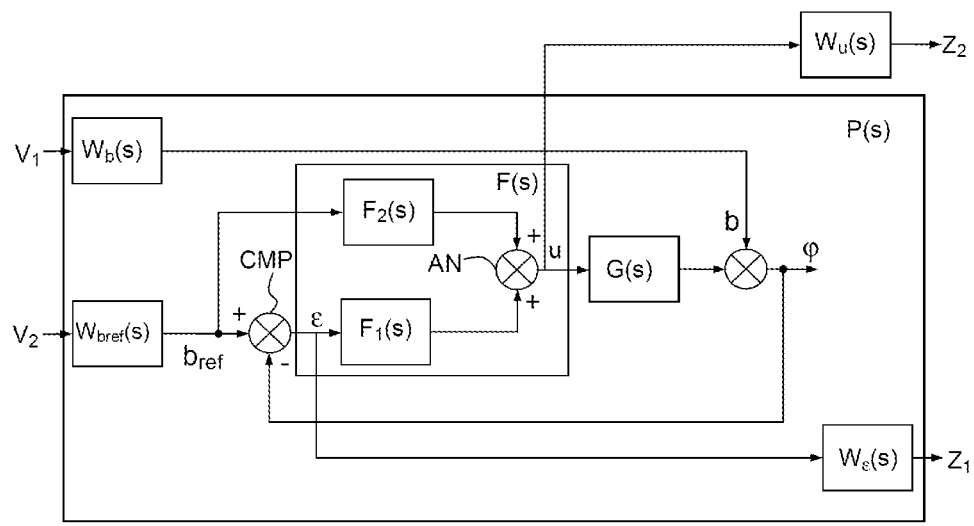
FIG. 12a, a block diagram of a PLL of the type of FIG. 4a, "augmented" by weighting functions aimed at rejecting the phase noise and, furthermore, at imposing a constraint on the VCO slaving signal.
Figure 12B:
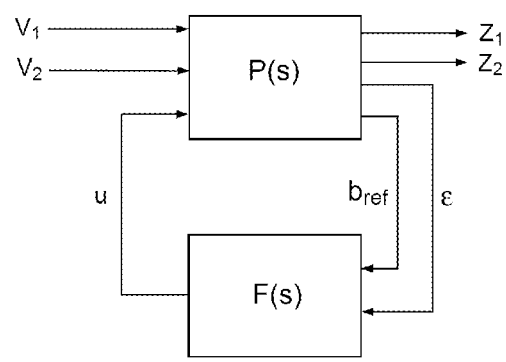

FIGS. 12a and 12b illustrate, in a complete and condensed representation respectively, the augmented system obtained if it is desired to comply both with a phase noise template at output (this being obtained by using the phase error $\epsilon$) and a template of PSD of the slaving signal u.

Figure 13A:
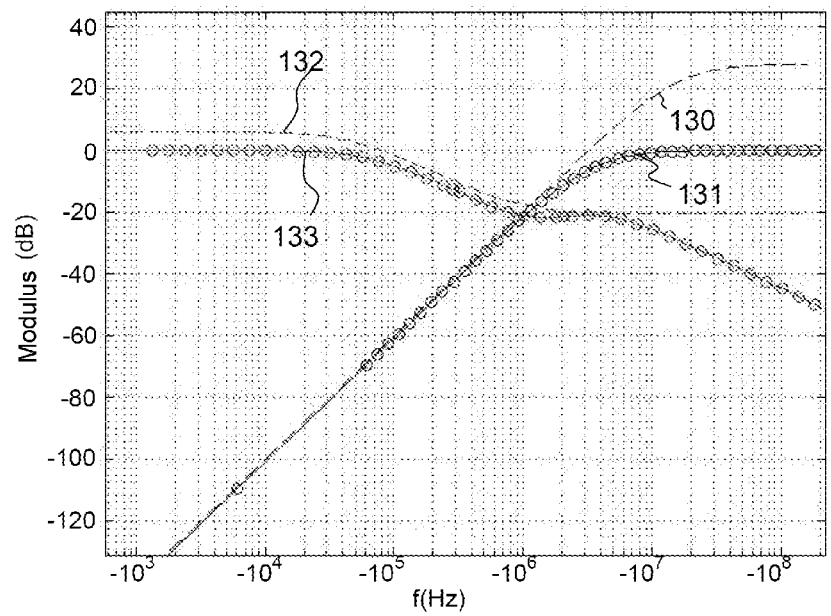
Figure 13B:
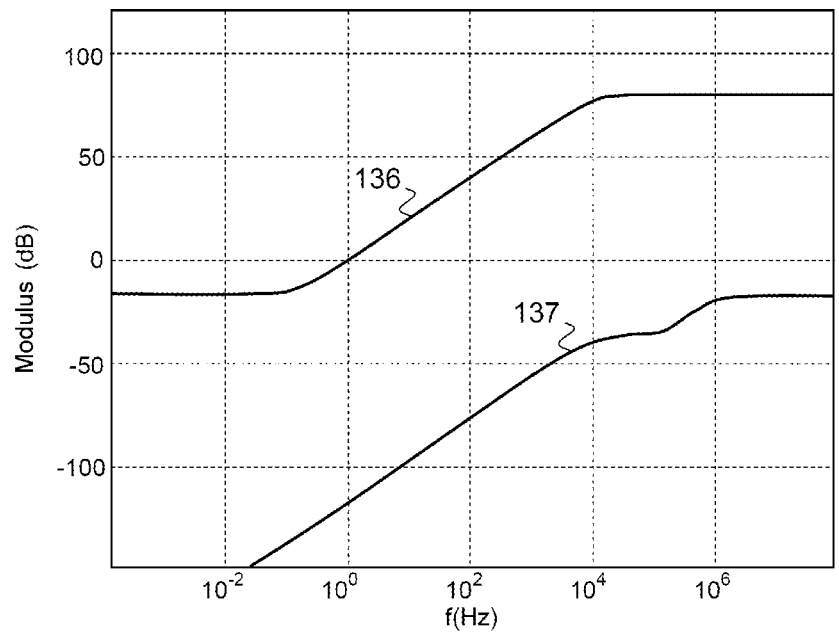
Figure 13C:
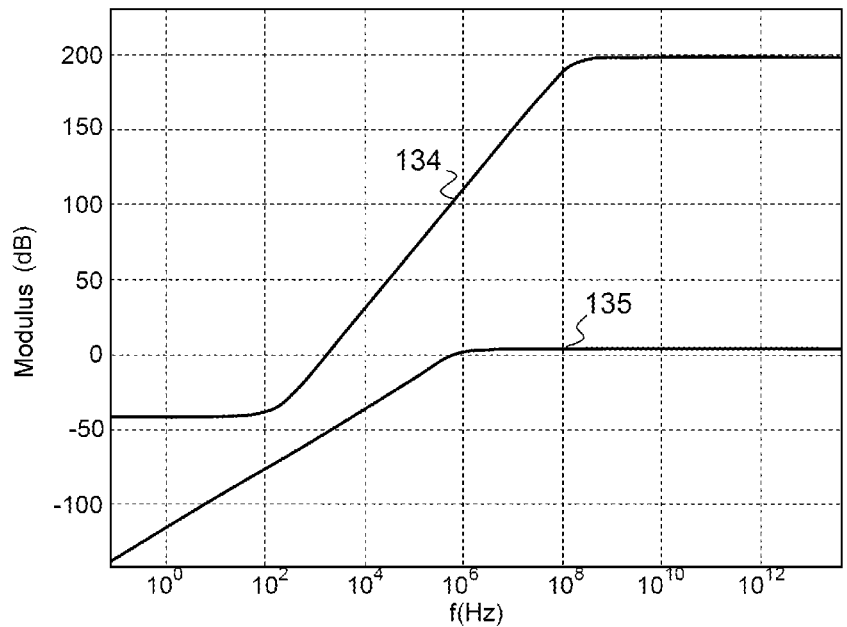

In FIG. 13a, curve 130 represents the simplified attenuation constraint for the noise of the VCO ($L_\phi/L_b$), curve 131 the modulus of the frequency response of the complementary sensitivity function actually obtained, $|T(j2\pi f)|$, curve 132 the simplified attenuation constraint for the noise of the reference ($L_\phi/L_{bref}$) and curve 133 the modulus of the frequency response of the sensitivity function actually obtained, $|S(j2\pi f)|$. It is noted that the constraints are complied with (curve 131 and 133 are below the respective constraints 130 and 132). Furthermore, the maximum value of the constraint 130 does not exceed 6 dB, thus implying robust stability. In FIG. 13b, curve 134 represents a constraint on the relation between the noise of the reference and the control signal u, and curve 135 the modulus of the frequency response of the transfer function for going from bref to u actually obtained. Similarly, in FIG. 13c, curve 136 represents a constraint on the relation between the noise of the VCO and the control signal u, and curve 137 the modulus of the frequency response of the transfer function for going from b to u actually obtained.

By applying this method of synthesis of the correctors to a particular case of specifications and for the topology of FIG. 4a, the following weightings are obtained:

$$W_{bref}(s) = \frac{0.04\,s + 3350}{s+1} \quad (5)$$

$$W_b(s) = \frac{6 \cdot 10^{-14} s^2 + 1.2 \cdot 10^{-4} s + 6 \cdot 10^4}{10^{-6} s^2 + 2 \cdot 10^{-3} s + 1} \quad (6)$$

$$W_u(s) = 2 \cdot 10^{-3} \quad (7)$$

$$W_\varepsilon(s) = 1 \quad (8)$$

Figure 13D:
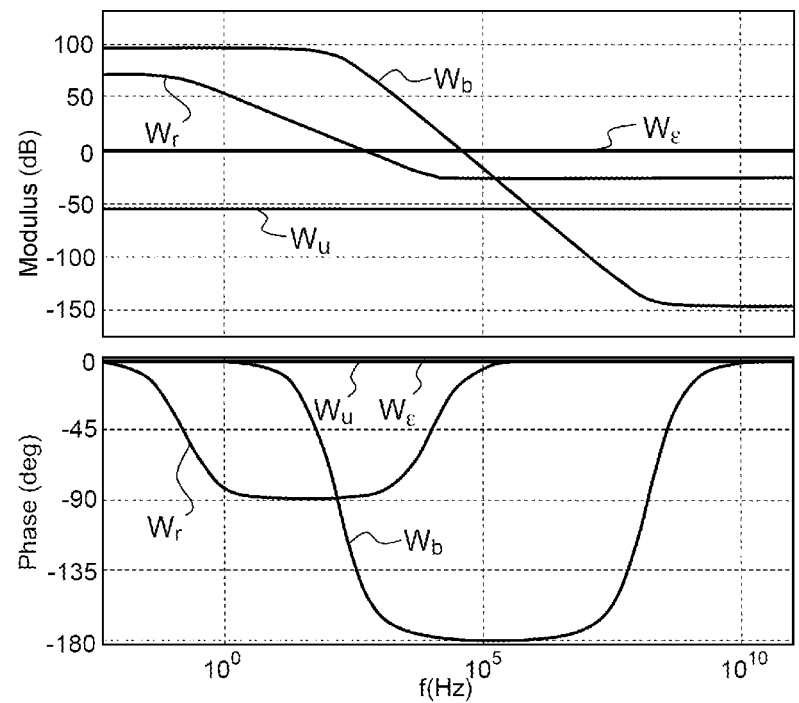
FIG. 13d, the Bode plots of these weightings.

The corresponding Bode plots are represented in FIG. 13d (upper panel: modulus; lower panel: phase).

Figure 14:
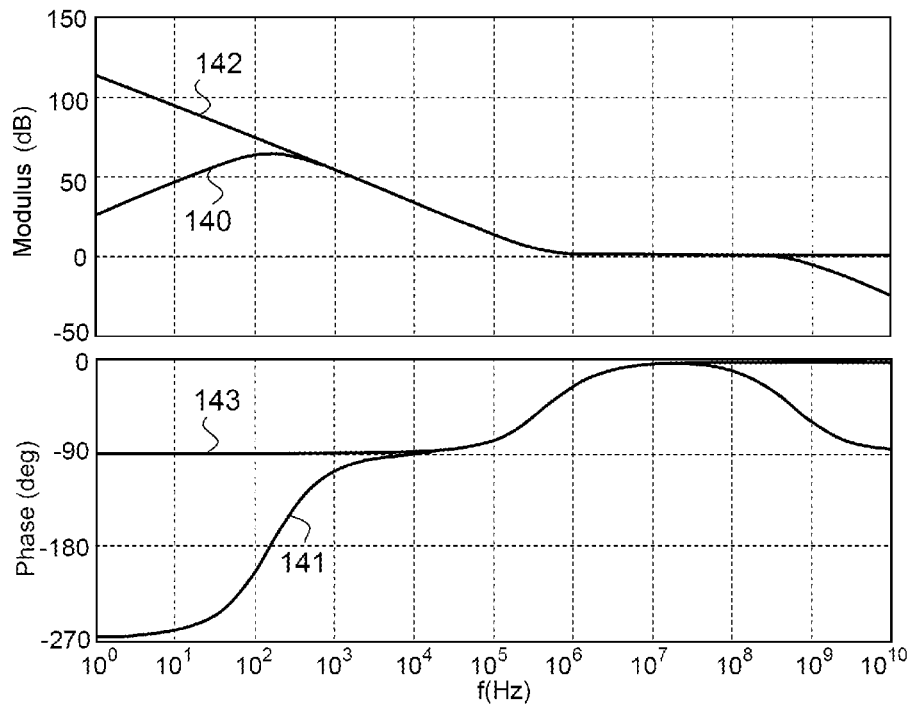
Figure 15:
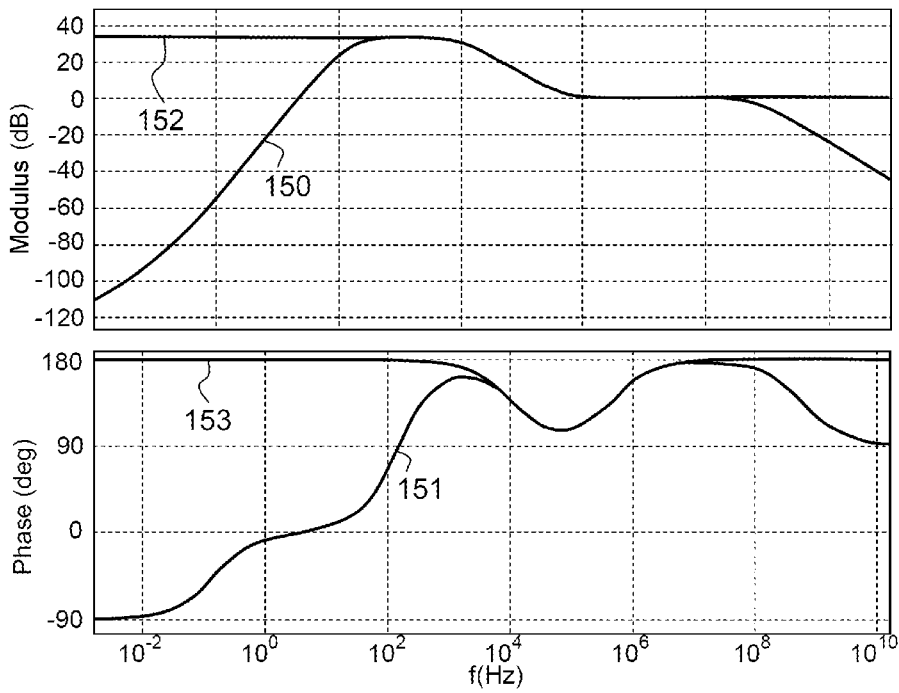

Although these weightings exhibit an order of not greater than 2 (they correspond to simplified constraints), they nonetheless lead to transfer functions of the correctors of significant order; curves 140 and 141 in FIG. 14 show respectively the modulus and the phase of $F_1(s)$, curves 150 and 151 in FIG. 15 show respectively the modulus and the phase of $F_2(s)$. These transfer functions can be simplified by deleting the poles and zeros lying outside the frequency band of interest. This yields the following transfer functions, whose moduli and phases are also represented in FIGS. 14 and 15 (curve 142: modulus of $F_1$ after simplification; curve 143: phase of $F_1$ after simplification; curve 152: modulus of $F_2$ after simplification; curve 153: phase of $F_2$ after simplification).

The transfer functions of the simplified correctors are:

$$F_1(s) = \frac{-1.41\,s + 1723 \cdot 10^6}{s + 6732 \cdot 10^4}$$

$$F_2(s) = \frac{1.5538\,s + 1658 \cdot 10^6}{s}$$

Figure 16:
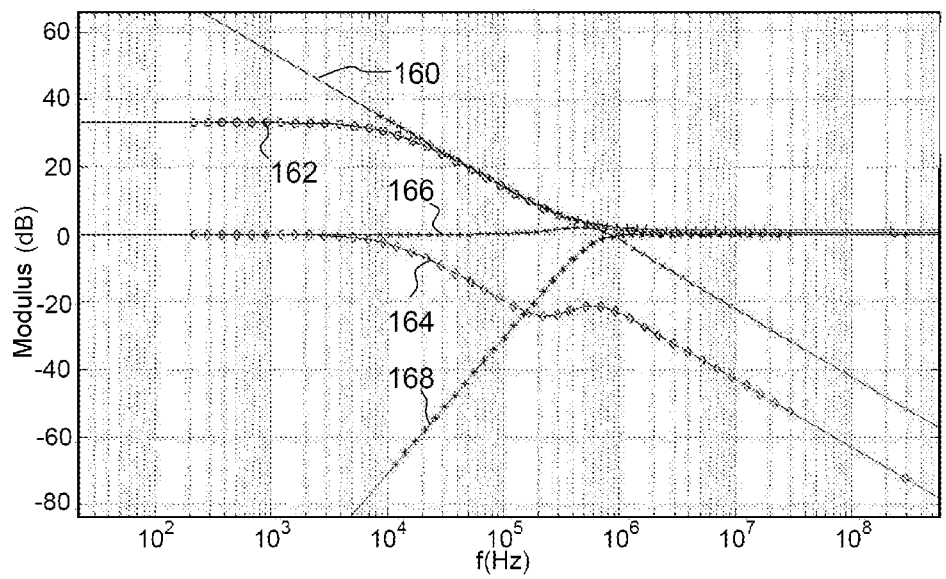
FIGS. 16 to 19, diverse graphics illustrating the technical result of the invention.

FIG. 16 represents the Bode plots of the amplitudes $F_1$ (curve 160), of $F_2$ (curve 162), of the reference noise shaped by the correctors of the PLL with two degrees of freedom (curve 164) and of the reference noise shaped by the single corrector of a PLL with one degree of freedom dimensioned in a conventional manner so as to reject the reference noise (curve 166), as well as the noise of the VCO shaped by the corrector $F_1$ of the PLL with two degrees of freedom or by the single corrector of the PLL with one degree of freedom (curve 168)—for the noise of the VCO, there is no difference.

Figure 17:
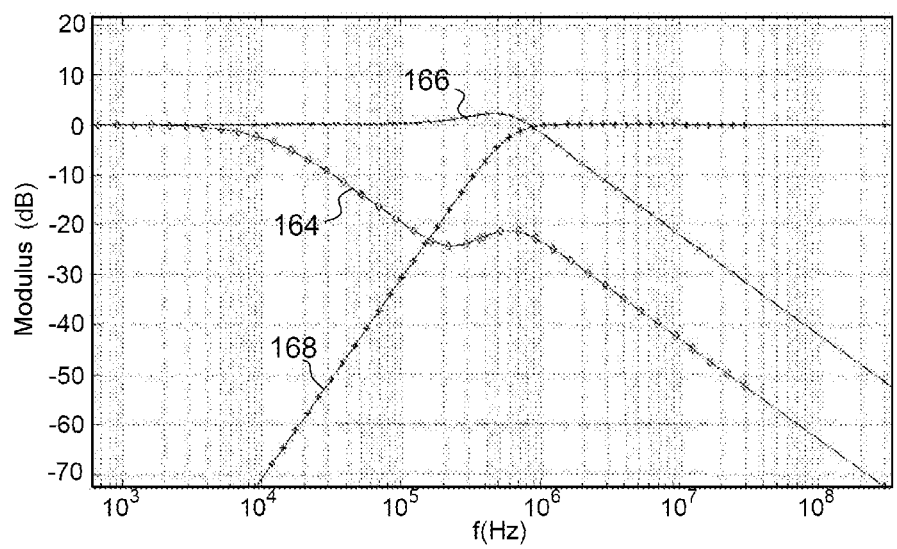

Curves 164, 166 and 168 are also reproduced magnified in FIG. 17 for greater clarity.

Figure 18:
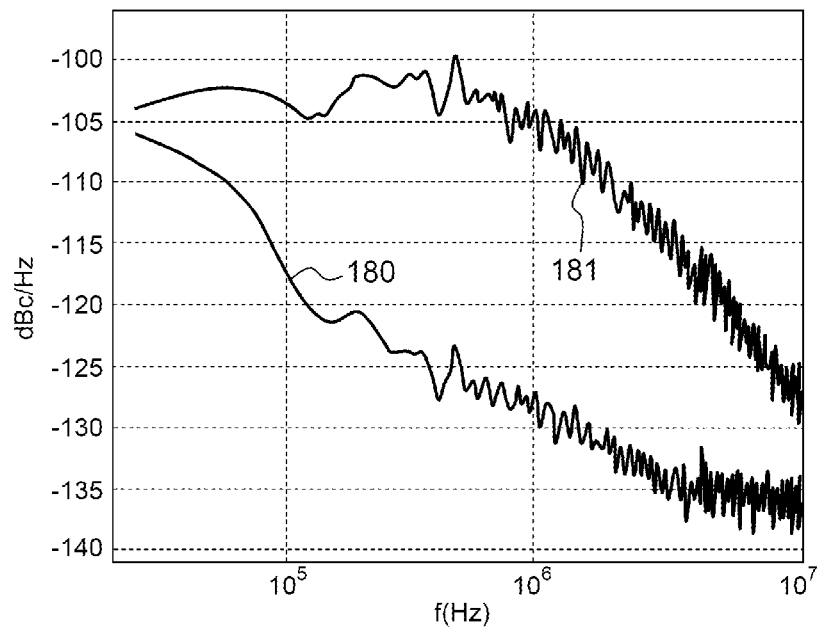

FIG. 18 illustrates the power spectral density of the output phase noise of the PLL with two degrees of freedom according to the invention (curve 180) compared with that of a PLL with one degree of freedom according to the prior art. The PSDs of the noise have been estimated by Welch's method and are expressed in dBc, with respect to the power of an ideal spectral line, with no noise.

Figure 19:
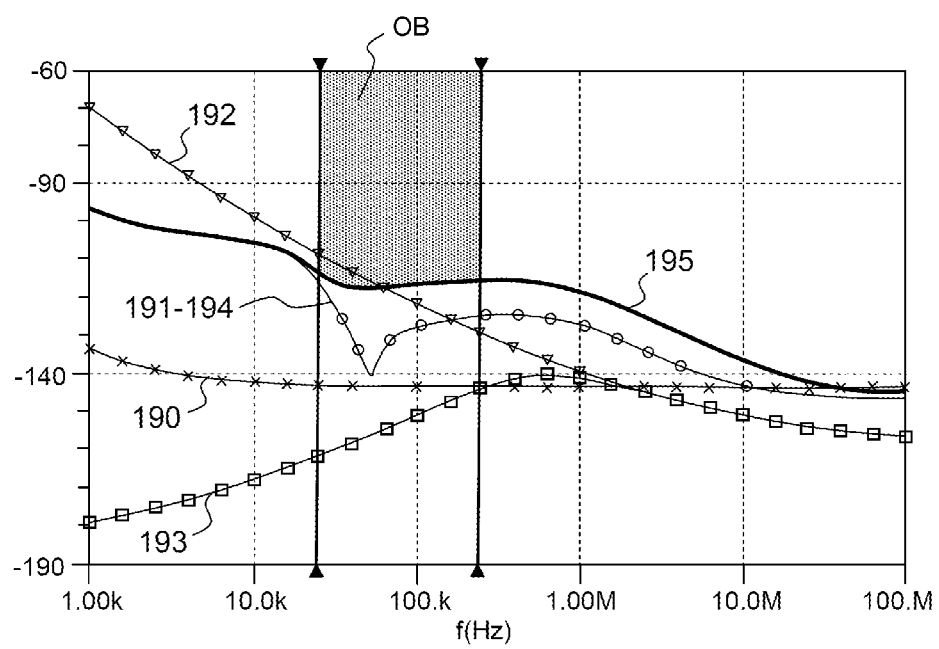

FIG. 19 presents, by way of illustration, the electrical simulation results for the performance of a PLL with two degrees of freedom exhibiting the two correctors thus synthesized. The curves represent the phase noise of the reference and of the VCO at the PLL output in open or closed loop as well as their summed contributions compared to the contributions in terms of noise of the PLL as a whole (curve 190: phase noise of the reference at output in open-loop; curve 191: phase noise of the reference at output in closed-loop; curve 192: phase noise of the VCO at output in open-loop; curve 193: phase noise of the VCO at output in closed-loop; curve 194, practically coincides with 191: sum of the contributions of the reference and of the VCO; curve 195: total phase noise at output). The operating band of the PLL, OB, extends between about 25 and 250 kHZ; the total phase noise is approximately constant inside this band, lying between −113 and −115 dB.

Once the correctors have been synthesized by the method described hereinabove, the design of the PLL can be finalized, and then the PLL can be produced in integrated or discrete form by conventional electronics techniques.

Figure 20:
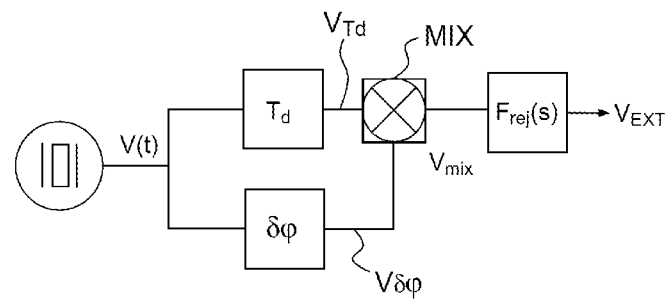
FIG. 20, the block diagram of a circuit for determining an estimation of the phase noise of a signal.

As was mentioned above, it is difficult to measure directly the phase noise signal of the reference or output signal of the PLL which must be provided as input to the corrector $F_2(s)$. For this reason, provision is advantageously made to use an estimator circuit, adapted for receiving as input a voltage signal (reference signal, or output signal of the PLL) and for providing the corrector $F_2(s)$ with an estimation of the phase noise affecting this signal (see FIGS. 4b and 5b). FIG. 20 shows a block diagram of such a circuit, receiving as input a periodic signal V(t) and comprising:

a first branch comprising a delayer module, introducing a delay $T_d$ of the signal V(t);

a second branch, connected in parallel with the first branch and comprising a phase-shifter module, introducing a phase shift $\delta\phi$ of the signal V(t), with $$\delta\varphi - \omega_{ref}T_d = \frac{\pi}{2} + 2\pi k, k \in Z, \quad (9)$$

where $\omega_{ref}$ is the frequency of the periodic signal a mixer MIX configured to multiply the delayed signal $V_{Td}$ arising from the first branch and the phase-shifted signal $V_{\delta\phi}$ arising from the second branch; and a so-called "rejector" filter $F_{rej}(s)$, of low-pass type receiving as input the output signal $V_{mix}$ of the said mixer and providing at its output a signal $V_{EXT}$ constituting the sought-after estimation of the phase noise affecting the input signal V.

From the formal point of view, the following demonstration presents the manner of operation of the phase noise estimator.

It is considered that the input signal V(t) is a sinusoid of angular frequency $\omega_{ref}$ affected by phase noise $b_{ref}(t)$:

$$V(t) = A\sin(\omega_{ref}t + b_{ref}(t)) \quad (10)$$

We then have:

$$V_{Td}(t) = A\sin(\omega_{ref} \times (t - T_d) + b_{ref}(t - T_d)) \quad (11)$$

$$V_{\delta\phi}(t) = A\sin(\omega_{ref}t + b_{ref}(t) - \delta\phi) \quad (12)$$

Trigonometric calculations make it possible to show that:

$$V_{mix}(t) = \frac{A^2}{2}[\cos(2\omega_{ref}t - \omega_{ref}T_d + b_{ref}(t-T_d) + b_{ref}(t) - \delta\varphi) + \\ \cos(b_{ref}(t-T_d) - b_{ref}(t) + \delta\varphi - \omega_{ref}T_d)] \quad (13)$$

The component of $V_{mix}$ at the angular frequency $2\omega_{ref}$ is intended to be filtered by the filter $F_{rej}$; furthermore, relation (9) makes it possible to simplify expression (13). We can therefore write $$Vmix(t) = \frac{A^2}{2}\sin(b_{ref}(t-T_d) - b_{ref}(t)) + VmixHF(t) \approx \approx \quad (14)$$

-continued $$\frac{A^2}{2}(b_{ref}(t-T_d) - b_{ref}(t)) + VmixHF(t)$$

where $V_{mixHF}(t)$ is the high-frequency component of $V_{mix}$ which is filtered.

In frequency representation, and by neglecting the component $V_{mixHF}(t)$, we can write $$V_{mix}(s) \approx \frac{A^2}{2}(1-e^{-sT_d})b_{ref}(s) = H(s)b_{ref}(s) \quad (15)$$

In order for the output signal of the circuit to provide an image of the phase noise, it would be necessary for the filter $F_{rej}$ to invert the transfer function $H(s)$; this is not possible since $H(s)$ is non-causal, but the inversion can be carried out over a limited band, or $H(s)$ can be linearized:

$$H(s) \to H_{lin}(s) = T_d \cdot s \quad (16)$$

We can therefore take $$F_{rej} = \frac{K}{\tau s + 1} \quad (17)$$

where K is a low-frequency gain and $\tau$ a time constant. The rejector filter is therefore a low-pass filter, this having been admitted by precedence.

As a variant, $H(s)$ can be integrated within the augmented process $P(s)$; in this case, it is taken into account during the synthesis of the correctors. Stated otherwise, the filter $F_{rej}$ can be "integrated" within one of the correctors of the PLL, in which case the phase noise estimation circuit may comprise only the delayer module Td, the phase-shifter module $\delta\phi$ and the mixer MIX.

The hardware embodiment of the delay and phase-shifter modules can depend on the PLL topology considered (see infra).

Figure 21:
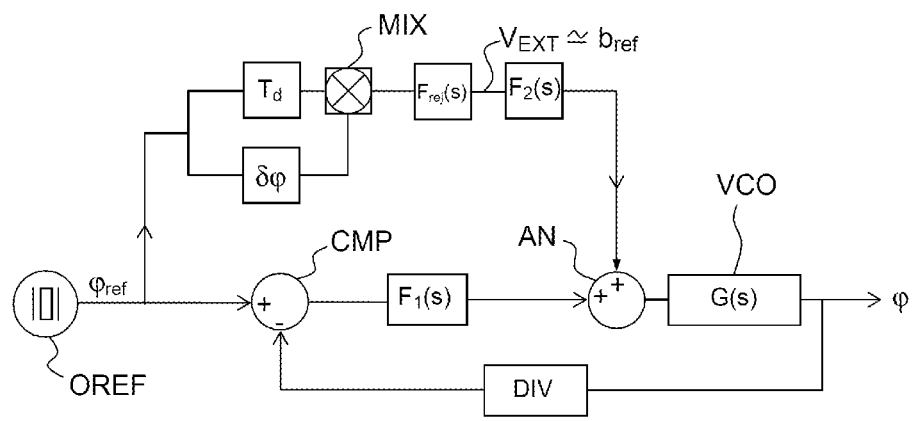
FIG. 21, the diagram of a PLL of the type of FIG. 4b, using a circuit for determining an estimation of the phase noise of the reference signal according to FIG. 20.

FIG. 21 shows the schematic diagram of a PLL with two degrees of freedom in feed-forward control modality with estimation of the noise of the reference, of the type of FIG. 4b. In this configuration, the noise-estimator circuit receives as input the reference signal, which here is generated by a quartz oscillator OREF. The feedback path of the loop comprises a frequency divider DIV; thus, the output signal of the PLL exhibits a frequency which is a multiple of that of the reference signal. The phase shift and the delay can be introduced by amplifiers loaded by RC lines and followed by voltage-comparator circuits, taking account of the fact that a delay is represented by a phase shift which varies linearly with frequency.

Figure 22:
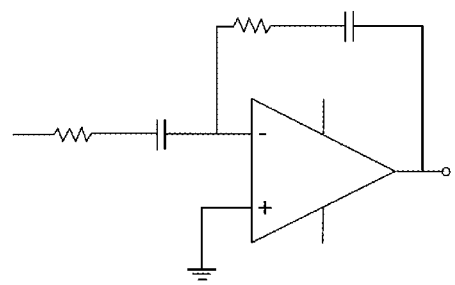
FIG. 22, an analogue PID corrector that can be used in the PLL of FIG. 21.

The filter $F_{rej}$ and the correctors $F_1$ and $F_2$ can be embodied, for example, in the form of PID (Proportional-Integral-Derivative) correctors based on operational amplifiers, as is illustrated in FIG. 22.

Figure 5B:
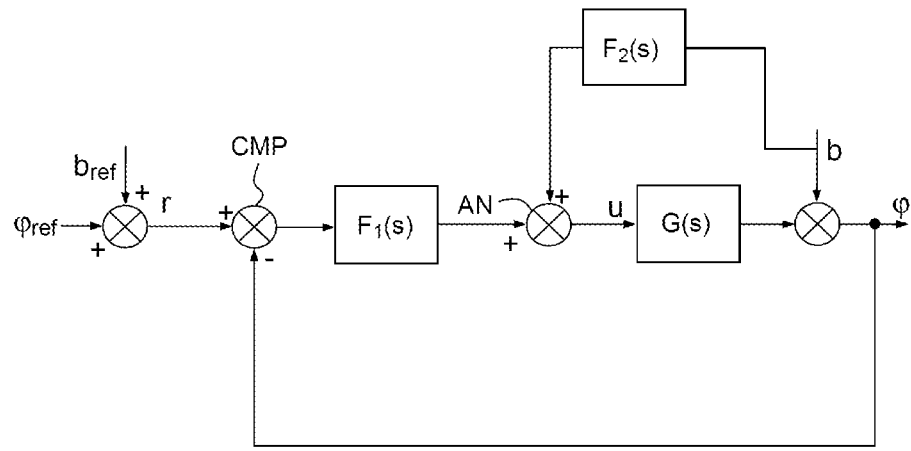
Figure 6A:
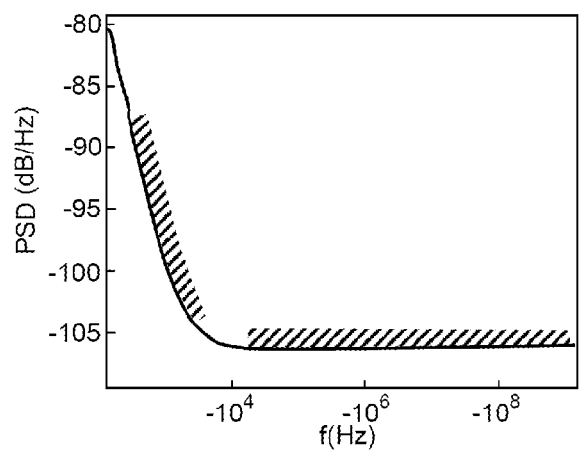
FIGS. 6a, 6b and 7, frequency templates serving as input data for a design method according to an embodiment of the invention.
Figure 6B:
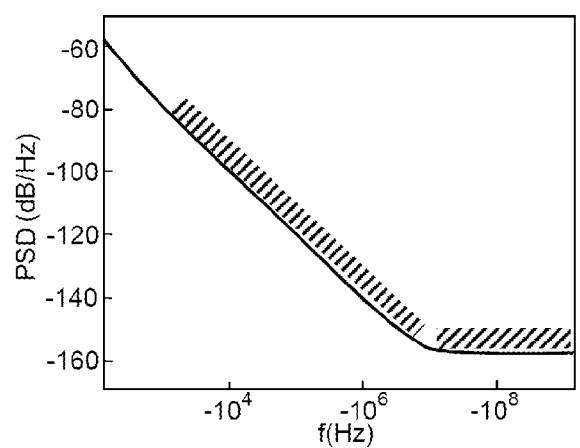
Figure 7:
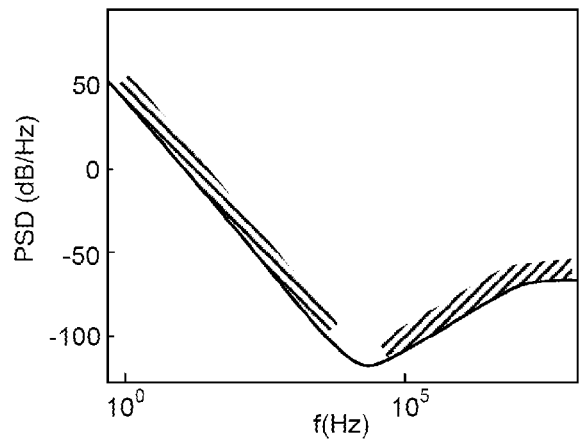
Figure 23:
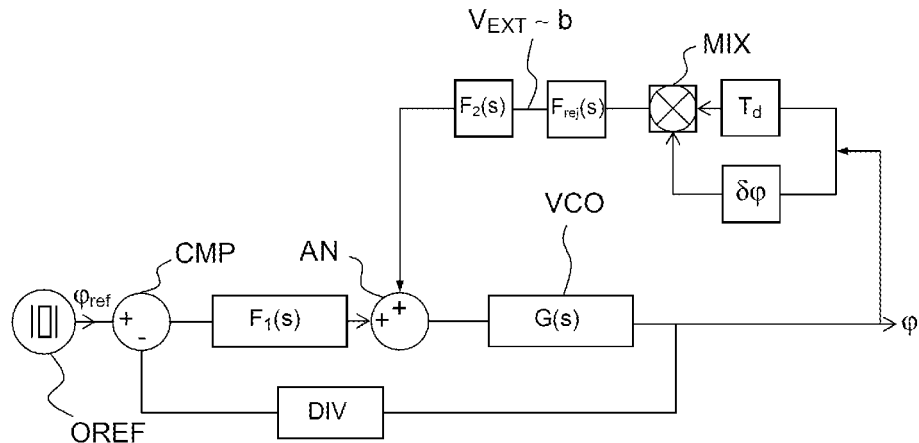
FIG. 23, the diagram of a PLL of the type of FIG. 5b, using a circuit for determining an estimation of the phase noise of the output signal according to FIG. 20.

FIG. 23 shows the schematic diagram of a PLL with two degrees of freedom in feedback modality with estimation of the noise of the VCO, of the type of FIG. 5b. This configuration, in which the noise-estimator circuit is arranged downstream of the VCO, allows simplifying the embodiment of the delay module and phase-shift module. Thus, the phase shift $\delta\phi$ can be carried out by using a quadrature VCO (QVCO) well known to the person skilled in the art if $\delta\phi=\pi/2$; more generally, a polyphase filter can make it possible to generate an arbitrary phase shift $\delta\phi$. It is also possible to use a system of coupled oscillators. By controlling the level of coupling of the oscillators it is thus possible to adjust the advance or the delay of one with respect to the other and to generate a controlled phase shift. The delay Td can be produced in a digital manner in the case of a ring VCO oscillator. In the case of sinusoidal signals, the delay $T_d$ can be introduced by an LC or equivalent propagation line, for example a slow-wave propagation line. An alternative sub-optimal solution consists in replacing the delay $T_d$ by a phase shift $\delta\phi_R=\omega_{VCO} \cdot T_d$ where $\omega_{VCO}$ is the angular frequency of the VCO when conditions have settled. The solution is sub-optimal in so far as the equivalent delay thus generated is not constant over all the frequencies around $\omega_{VCO}$.

Finally the mixer can be embodied by logic gates of NOR or XNOR type or a Gilbert cell.

Figure 25:
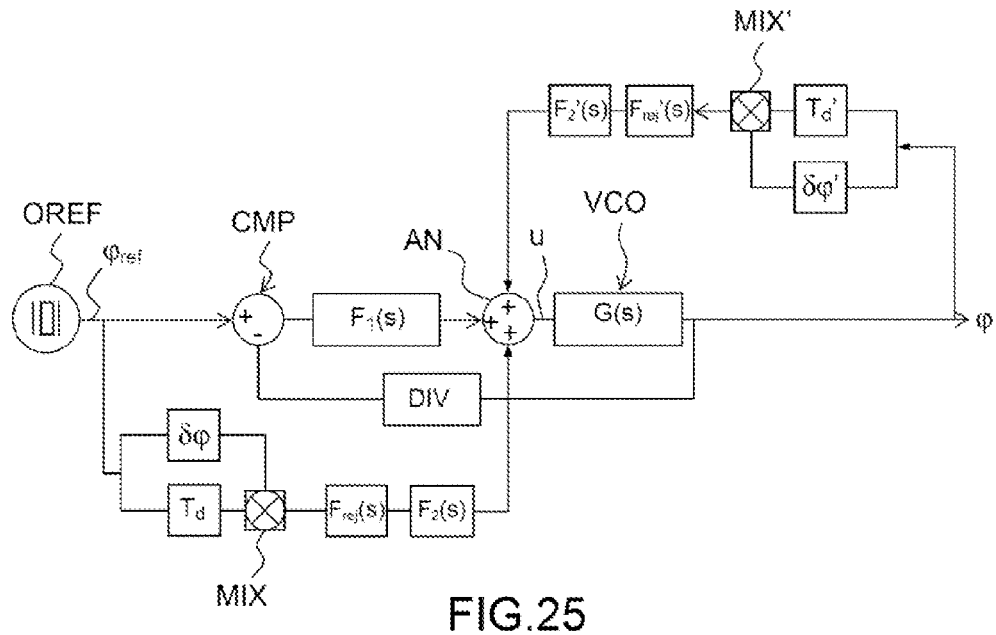
FIG. 25, the block diagram of a PLL with three degrees of freedom using a second corrector in feed-forward control mode and a third corrector in feedback mode.

FIG. 25 shows the schematic diagram of a PLL with three degrees of freedom combining feed-forward (corrector $F_2$) and feedback (corrector $F'_2$) control with estimation of the noise of the reference and of the noise of the VCO. The delay, phase-shift modules, the mixer and the rejector filter of the phase estimator which is used to estimate the noise of the VCO are identified by the references $T_d'$, $\delta\phi'$, MIX' and $F_{rej}'$ to distinguish them from the corresponding elements of the reference phase estimator.

Figure 24:
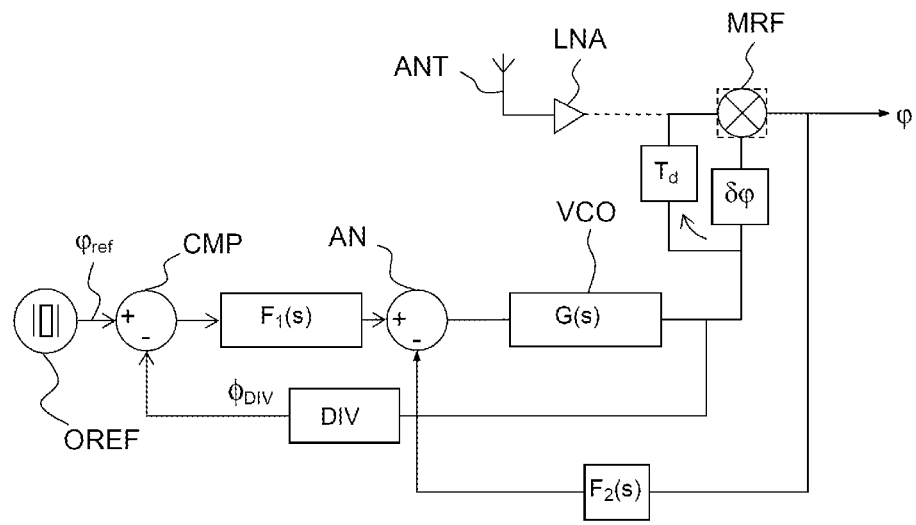
FIG. 24, the block diagram of a radio frequency reception chain comprising a PLL according to FIG. 23.

FIG. 24 shows the schematic diagram of a radio frequency reception chain using a PLL with two degrees of freedom using a PLL of the type of 23 in the guise of local oscillator for the conversion to baseband, or to intermediate frequency, of the radio frequency signal picked up by an antenna ANT and pre-amplified by a low-noise amplifier LNA. Advantageously, the radio frequency mixer MRF is used in the guise of mixer of the noise estimation circuit, thereby enabling a saving of one element to be made. The local oscillator oscillates at the carrier frequency $f_0$; the output of this oscillator is multiplied, by the mixer, by a part of itself which originates from an intentional "leak" across the delay module $T_d$ (represented by an arrow in the figure), thereby producing a signal at the frequency $2f_0$, which is filtered by the corrector $F_2$, and a baseband signal, which constitutes the feedback signal of the PLL. The low-pass filter $F_{rej}$ is not represented in the diagram of FIG. 24 since it is integrated within the corrector $F_2$.

Figure 26:
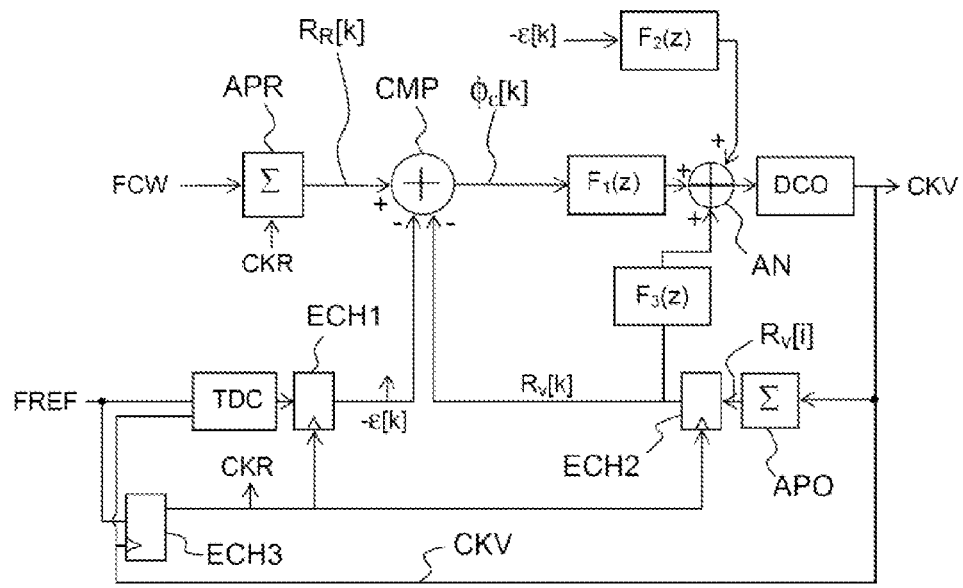
FIG. 26, the application of the present invention to an entirely digital PLL.

The invention is not limited to the case of an analogue PLL, but may also relate to a digital PLL, and notably an All-Digital PLL (ADPLL) such as described in the articles [STA-2004] and [STA-2005], as illustrated in FIG. 26.

In this ADPLL, a digitally controlled oscillator DCO produces a signal CKV which must be slaved in phase to a reference signal of lower frequency, FREF. The ratio of the frequency of the DCO to that of the reference is not necessarily integer; it is therefore necessary to generate a re-timed reference signal CKR, used as clock signal. This signal CKR is obtained by oversampling FREF by the high-frequency signal CKV with the aid of a flip-flop ECH1.

An accumulator APO counts the rising (or falling) edges of the signal CKV; the counting signal thus obtained, indicated by $R_v[i]$, is re-timed to the tempo of the clock signal CKR with the aid of a flip-flop ECH2; the re-timed signal is indicated by $R_v[k]$.

The signal $R_R[k]$ is obtained by accumulating, with the aid of an accumulator APR, a binary word FCW equal to the ratio of the frequencies of CKV to FREF.

The signal $\epsilon[k]$ is obtained with the aid of a Time-to-Digital Converter TDC quantizing the temporal offset between the rising (or falling) edges of the signals FREF and CKV, whose output is re-timed to the tempo of the clock signal CKR with the aid of a flip-flop ECH3.

An estimation $\phi_E[K]$ of the phase error between FREF and CKV is given by:

$$\phi_E[k]=R_R[k]-R_v[k]+\epsilon[k] \tag{18}$$

It should be pointed out that, in this context, the "phase" of a signal is given by the number of its rising (or falling) edges, counted from an initial instant.

The error signal $\phi_E[k]$ is provided as input to a first transfer function corrector $F_1(z)$. In accordance with the invention, the ADPLL also comprises a second corrector in feed-forward control mode, $F_2(z)$, receiving as input the signal $\epsilon[k]$, and/or a third corrector in feedback mode, $F_3(z)$, receiving as input the signal $R_v[k]$. As in an analogue embodiment, the command signals generated by the correctors $F_1(z)$, $F_2(z)$ and/or $F_3(z)$ are combined in an adder node AN to obtain a (digital) signal for driving the oscillator DCO.

REFERENCES

[Bib-1992] Johen E. Bibel, Stephen Malyevac "Guidelines for the selection of weighting functions for H-infinity control", AD-A251 781 Naval Surface Warfare Center, January 1992, URL: http://www.dtic.mil/dtic/tr/fulltext/u2/a251781.pdf.

[ScF-2009] Scorletti G. Fromion V. "Automatique fréquentielle avancée", polycopie de cours, Sciences de l'ingénieur, http://cel.archives-ouvertes.fr/cel-00423848.

[SkP-2005] S. Skogestad and I. Postlethwaite, "Multivariable Feedback Control, Analysis and Design", John Wiley and Sons Chischester, 2005.

[ChM-2007] W. Chaivipas, A. Matsuzawa, "Analysis and Design of Direct Reference Feed-Forward. Compensation for Fast-Settling All-Digital Phase-Locked Loop". IEICE TRANS. ELECTRON., VOL.E90-C, NO.4 April 2007

[SNI-2012] B. Indu Rani, C. K. Aravind G. Saravana Ilango, C. Nagamani, "A three phase PLL with a dynamic feed forward frequency estimator for synchronization of grid connected converters under wide frequency variations". Electrical Power and Energy Systems, 41:63-70, 2012.

[STA-2004] R. B. Staszewski et al., "All-Digital TX Frequency Synthesizer and Discrete-time Receiver for Bluetooth Radio in 130-nm CMOS", IEEE Journal of Solid-State Circuits, Vol. 39, No. 12, December 2004

[STA-2005] R. B. Staszewski, P. T. Balsara "Phase-Domain All-Digital Phase-Locked Loop", IEEE Transaction on Circuits and Systems—II: Express Briefs, Vol. 52, No. 3, March 2005.

The invention claimed is:

1. A method of designing a phase-locked loop, the phase-looked loop being of the type comprising:
    a controlled-frequency oscillator;
    a phase comparator, configured to determine a phase difference between an output signal of the said controlled-frequency oscillator and a reference signal;
    a first corrector, configured to receive as input a signal representative of the said phase difference and to generate at its output a first correction signal;
    at least one second corrector, configured to receive as input a signal representative of or affected by a phase noise of the said reference signal or of the said output signal of the said controlled-frequency oscillator and to generate at its output a second correction signal; and
    a circuit for generating a slaving signal for the said controlled-frequency oscillator from the said first and second correction signals;
    the said method comprising a step of determining transfer functions of the said correctors allowing rejection, in one and the same frequency band, the phase noise of the said reference signal and the phase noise of the said output signal of the said controlled-frequency oscillator, and wherein said step is implemented, by means of a computer, by applying the H-infinity (H∞) method utilizing:
    at input, a first weighting function for a phase noise of the said controlled-frequency oscillator and a second weighting function for a phase noise of a reference signal, and which are determined on the basis of nominal power spectral densities of the said noise; and
    at output, at least one third weighting function for a phase noise of an output signal of the phase-lock loop or of an error in tracking the said reference signal, determined on the basis of a phase noise power spectral density template of the said output signal having to be complied with.

2. The method of claim 1, wherein the said step of determining transfer functions of the said correctors comprises the following sub-steps:
    a) determining a nominal power spectral density of the said reference signal;
    b) determining a nominal power spectral density of the phase noise of the said controlled-frequency oscillator;
    c) determining a phase noise power spectral density template of the said output signal having to be complied with;
    d) determining, on the basis of the said nominal power spectral densities and of the said power spectral density template, at least the said first, second and third weighting functions;
    e) constructing an augmented system through the said weightings; and
    f) applying the H-infinity (H∞) method to the said augmented system so as to synthesize the transfer functions of the said correctors.

3. The method of claim 2, wherein the said step d) also comprises the determination of a fourth weighting function at output for the power spectral density of the said slaving signal on the basis of a power spectral density template of the said slaving signal to be complied with.

4. The method of claim 2, also comprising a sub-step d') of simplifying the weighting functions determined during sub-step d), the weighting functions thus simplified being used during the said sub-step e), the said simplification being implemented by approximating the said weighting functions by transfer functions of lower order and of smaller modulus at least over a spectral operating span of the phase-locked loop.

5. The method of claim 2, also comprising a sub-step g) of simplifying the transfer functions synthesized during the said sub-step f), the said simplification being implemented by approximating the said transfer functions by transfer functions of lower order.

6. The method of claim 2, wherein the said step f) is implemented with an extra constraint, according to which the modulus of the transfer function going from the said output signal of the said controlled-frequency oscillator to the said reference signal exhibits, in at least one spectral span, a slope of greater than or equal to +20 db/decade and preferably of greater than or equal to 40 dB/decade.

7. The method of claim 1, wherein the said phase-locked loop comprises at least one third corrector configured to receive as input a signal representative of or affected by a phase noise generated inside the said loop, other than the said phase noise of the said output signal of the said controlled-frequency oscillator, and to generate at its output a third correction signal, the said circuit for generating a slaving signal for the said controlled-frequency oscillator being configured to generate the said slaving signal also on the basis of the said third correction signal, the said step, implemented by the said H-infinity (H∞) method, of determining transfer functions of the said correctors using as input also a weighting function for the said phase noise other than the said phase noise of the said output signal of the said controlled-frequency oscillator, and also determined on the basis of the power spectral density of the said noise.

8. A method for fabricating a phase-locked loop, of the type comprising:
- a controlled-frequency oscillator;
- a phase comparator for determining a phase difference between an output signal of the said controlled-frequency oscillator and a reference signal;
- a first corrector, configured to receive as input a signal representative of the said phase difference and to generate at its output a signal termed the first correction signal;
- at least one second corrector, configured to receive as input a signal representative of or affected by a phase noise of the said reference signal or of the said output signal of the said controlled-frequency oscillator and to generate at its output a signal termed the second correction signal; and
- a circuit for generating a signal for slaving the said controlled-frequency oscillator on the basis of the said first and second correction signals;

the said method comprising:
- a step of design of the said phase-locked loop; and
- a step of physical production of the phase-locked loop thus designed;

wherein the said design step is implemented by a method according to claim 1.

9. A method for fabricating a phase-locked loop, of the type comprising:
- a controlled-frequency oscillator;
- a phase comparator for determining a phase difference between an output signal of the said controlled-frequency oscillator and a reference signal;
- a first corrector, configured to receive as input a signal representative of the said phase difference and to generate at its output a signal termed the first correction signal;
- at least one second corrector, configured to receive as input a signal representative of or affected by a phase noise of the said reference signal or of the said output signal of the said controlled-frequency oscillator and to generate at its output a signal termed the second correction signal; and
- a circuit for generating a signal for slaving the said controlled-frequency oscillator on the basis of the said first and second correction signals;

the said method comprising:
- a step of design of the said phase-locked loop; and
- a step of physical production of the phase-locked loop thus designed;

wherein the said phase-locked loop comprises at least one third corrector, configured to receive as input a signal representative of or affected by a phase noise generated inside the said loop, other than the said phase noise of the said output signal of the said controlled-frequency oscillator, and to generate at its output a third correction signal, the said circuit for generating a slaving signal for the said controlled-frequency oscillator being configured to generate the said slaving signal also on the basis of the said third correction signal, the said design step being implemented by the method of claim 7.

10. A phase-locked loop comprising:
- a controlled-frequency oscillator;
- a phase comparator for determining a phase difference between an output signal of the said controlled-frequency oscillator and a reference signal;
- a first corrector, configured to receive as input a signal representative of the said phase difference and to generate at its output a signal termed the first correction signal;
- at least one second corrector, configured to receive as input a signal representative of or affected by a phase noise of the said reference signal or of the said output signal of the said controlled-frequency oscillator and to generate at its output a signal termed the second correction signal; and
- a circuit for generating a signal for slaving the said controlled-frequency oscillator from the said first and second correction signals;
- wherein the said first and second correctors exhibit non-constant transfer functions, chosen so as to allow the rejection, in one and the same frequency band, of the phase noise of the said reference signal and of the phase noise of the said output signal of the said controlled-frequency oscillator.

11. The phase-locked loop of claim 10, wherein the said second corrector is configured to receive as input:
- either a signal representative of the phase of the said reference signal;
- or an estimation of the phase noise of the said reference signal.

12. The phase-locked loop of claim 11, also comprising a circuit for determining an estimation of the phase noise of the said reference signal comprising:
- a delayer module, configured to generate a version of said reference signal delayed by a time (Td) relative to said reference signal;
- a phase-shifter module, configured to generate a version of the said reference signal exhibiting a phase shift δφ, with $$\delta\varphi - \omega_{ref} T_d = \frac{\pi}{2} + 2\pi k, k \in Z,$$

where $\omega_{ref}$ is the frequency of the said reference signal and where Td is the time relative to said reference signal and k is selected from Z, where Z is the domain of all integers; and
- a mixer configured to receive as input the output signals of the said delayer and phase-shifter modules and to provide their product at its output;
- the said second corrector being configured to receive as input the said estimation of the phase noise of the said reference signal.

13. The phase-locked loop of claim 10, wherein the said second corrector is configured to receive as input:
- either a signal representative of the phase of the said output signal of the said controlled-frequency oscillator;

or an estimation of the phase noise of the said output signal of the said controlled-frequency oscillator.

14. The phase-locked loop of claim 13, also comprising a circuit for determining an estimation of the phase noise of the said output signal comprising:
a delayer module, configured to generate a version of said output signal delayed by a time (Td) relative to said output signal;
a phase-shifter module, configured to generate a version of the said output signal exhibiting a phase shift δφ, with $$\delta\varphi - \omega_o T_d = \frac{\pi}{2} + 2\pi k, k \in Z,$$

where $\omega_o$ is the frequency of the said output signal and where Td is the time relative to said output signal and k is selected from Z, where Z is the domain of all integers; and
a mixer configured to receive as input the output signals of the said delayer and phase-shifter modules and to provide their product at its output;
the said second corrector being configured to receive as input the said estimation of the phase noise of the said output signal.

15. The phase-locked loop of claim 10, also comprising at least one third corrector, configured to receive as input: a signal representative of or affected by a phase noise generated inside the said loop, other than the said phase noise of the said output signal of the said controlled-frequency oscillator, and to generate at its output a third correction signal, the said circuit for generating a slaving signal for the said controlled-frequency oscillator being configured to generate the said slaving signal also on the basis of the said third correction signal.

16. A radiofrequency reception chain comprising:
a radiofrequency preamplifier;
a mixer configured to receive as input an output signal of the said radiofrequency preamplifier and a frequency conversion sinusoidal signal, and to provide as output a signal at intermediate frequency; and
a circuit for generating the said frequency conversion sinusoidal signal;
wherein the said circuit for generating the said frequency conversion sinusoidal signal comprises the phase-locked loop of claim 14, using the said mixer in the guise of mixer of the said circuit for determining an estimation of the phase noise of the said output signal, and an oscillator configured to generate the said reference signal.

* * * * *